(12) United States Patent
Clune

(10) Patent No.: US 8,135,565 B2
(45) Date of Patent: Mar. 13, 2012

(54) METHOD AND SYSTEM FOR TRANSFERRING DATA BETWEEN A DISCRETE EVENT ENVIRONMENT AND AN EXTERNAL ENVIRONMENT

(75) Inventor: Michael I. Clune, Natick, MA (US)

(73) Assignee: The MathWorks, Inc., Natick, MA (US)

( * ) Notice: Subject to any disclaimer, the term of this patent is extended or adjusted under 35 U.S.C. 154(b) by 473 days.

(21) Appl. No.: 11/841,940

(22) Filed: Aug. 20, 2007

(65) Prior Publication Data

US 2008/0052060 A1 Feb. 28, 2008

Related U.S. Application Data

(63) Continuation of application No. 11/024,148, filed on Dec. 21, 2004, now Pat. No. 7,925,477.

(60) Provisional application No. 60/611,571, filed on Sep. 20, 2004.

(51) Int. Cl.
*G06F 7/60* (2006.01)
*G06F 17/10* (2006.01)
*G06G 7/48* (2006.01)

(52) U.S. Cl. ..................... 703/6; 703/2; 703/3
(58) Field of Classification Search .................. 703/2, 3, 703/6
See application file for complete search history.

(56) References Cited

U.S. PATENT DOCUMENTS 4,985,860 A 1/1991 Vlach

OTHER PUBLICATIONS

The Mathworks, Inc., Stateflow User's Guide, Version 1, Jan. 1998, 477 pages.*
Anylogic User's Manual, *XJ Technologies Company Ltd.*, 1992-2004; pp. 2-4, 8-9, 21-23, 41-43, 55-57, 155-156, 218-221, 270-271.
Clune, M., et al., Panel session on, "Challenges and solution techniques for hybrid simulation," 43rd IEEE Conference on Decision and Control, Dec. 14, 2004.
Fall, K., et al., "The *ns* manual (formerly *ns* notes and documentation)," The VINT Project, Apr. 14, 2005; Chapters 4-8, pp. 37-85, Chapter 11, pp. 110-114.
Fujimoto, R., "Parallel discrete event simulation," *Communications of the ACM*, Oct. 1990: 1-8.
"Graphical design environment for CAMeL-Tools," http://wwwcs.uni-paderborn.de/SFB376/projects/c1/Paper/vcamel.html. Sep. 18-20, 1996; 1-10.
Henricksson, D., et al., "TrueTime 1.2—Reference Manual," pp. 7-79 (2004).
Holz, E., "SDL-2000 Tutorial," *Formal Methods Europa.*, pp. 1-49 (2001).
Liu, J., et al., "Component-based hierarchical modeling of systems with continuous and discrete dynamics," *CACD '00*, pp. 1-10 (2000).

(Continued)

*Primary Examiner* — Kamini S Shah
*Assistant Examiner* — Suzanne Lo
(74) *Attorney, Agent, or Firm* — Nelson Mullins Riley & Scarborough LLP

(57) ABSTRACT

In one embodiment, a model of a system includes one or more event-driven blocks and one or more time-driven blocks. The model is executed in part by receiving an entity from a event-driven block, and in response to receiving the entity, generating a time-varying data signal descriptive of the entity. The data signal is passed to one or more time-driven blocks, which generate one or more results at least in part from the data signal, and display at least some of the one or more results.

24 Claims, 17 Drawing Sheets

OTHER PUBLICATIONS

Liu, J., et al., "Actor-oriented control system design: A Responsible framework perspective," *IEEE Transactions on Control Systems Technology*, vol. 12(2):250-62 (2004).

Liu, J., et al., "Motivating hierarchical run-time models for measurement and control systems," *Ptolemy Miniconference*, Berkeley, CA, Mar. 22-23, 2001; 1-3.

Liu, J., et al., "System-level modeling of continuous and discrete dynamics," *Ptolemy Miniconference*, Berkeley, CA, Mar. 22-23, 2001; 1-4.

Martin, D.E., et al., "Analysis and simulation of mixed-technology VLSI systems," *Journal of Parallel and Distributed Computing*, vol. 62:468-93 (2002).

Martin, R.C., "UML tutorial: Sequence diagrams," *Engineering Notebook Column*, Apr. 1-5, 1998.

Murata, T., "Petri nets: Properties, analysis and applications," *Proceedings of the IEEE*, vol. 77(4):541-80 (1989).

Overhauser, D., et al., "Evaluating mixed-signal simulators," *IEEE*, pp. 113-120 (1995).

Overhauser, D., et al., "IDSIM2: An Environment for mixed-mode simulation," *IEEE*, vol. 5(2):1-4 (1990).

System C Version 2.0 Users Guide, "Update for SystemC 2.0.1," 1996-2002, Chapter 1, pp. 1-8; Chapter 2, pp. 9-38; Chapter 5, pp. 71-82.

"The Almagest, vol. 1—Ptolemy 0.7 User's Manual," *Ptolemy*, Mar. 3, 1997; Sections 1.4-1.9, 2.5-2.8, 4.9, 9.1-9.5, 12.1-12.4, 16.1, 16.3.

Vlach, M., "Modeling and simulation with Saber," *IEEE*, T-11.1-11.9 (1990).

Zeigler, B.P., et al., "Creating simulations in HLA/RTI using the DEVS modeling framework," *DEVS/HLA Tutorial*, 1-8 (1998).

Bailey, Stephen A. et al., "1076.1 Ballot Resolution Committee, Comment Resolution Report," retrieved online at http://www.eda.org/vhdl-ams-ftp_files/lang_design/BRC/CRR15_Meta_issues.txt (2005).

Berkeley.edu, Ptolemy II Frequently Asked Questions, retrieved online at http://ptolemy.eecs.berkeley.edu/ptolemyII/ptIIfaq.htm (2005).

Chen, Gilbert et al., "Lookahead, Rollback and Lookback: Searching for Parallelism in Discrete Event Simulation," retrieved online at http://citeseer.ist.psu.edu/551717.html (2002).

Connell, Jon et al., "Early Hardware/Software Integration Using SystemC 2.0," retrieved online at http://www.synopsys.com/products/designware/system_studio/esc_paper_552.pdf (2002).

Diamond, Bob et al., "Extend, User's Manual, Version 4, For Macintosh or Windows," Imagine That, Inc., (1997).

Grand Valley State University, "20. Sequential Function Charts," retrieved online at http://www.eod.gvsu.edu/~jackh/books/plcs/chapters/plc_sfc.pdf (2007).

hzeeland.nl, "Introduction to VHDL—A Tutorial," retrieved online at http://www.hzeeland.nl/~wrijker/dsy/vhdl/algemvhdl/fcmi/vhdlintro.html (2005).

Information Science Institute, "The Network Simulator—ns-2," retrieved online at http://www.isi.edu/nsnam/ns/ (2005).

International Engineering Consortium, "Specifications and Description Language (SDL)," retrieved online at http://www.iec.org/online/tutorials/acrobat/sdl.pdf (2005).

Mosterman, Pieter J. et al., "Modeling Petri Nets as Local Constraint Equations for Hybrid Systems Using Modelica™," retrieved online at http://citeseer.ist.psu.edu/359408.html (1998).

OPNET Technologies, Inc., "Modeler, Accelerating Network R&D," retrieved at www.opnet.com (2004).

Perumalla, Kalyan et al., "Using reverse circuit execution for efficient parallel simulation of logic circuits," retrieved online at http://www.cc.gatech.edu/~kalyan/papers/rccircuit-spie02.pdf (2001).

Rensselaer Polytechnic Institute, "Parallel Discrete Event Simulation," retrieved online at http://www.rpi/edu/~gucluh/pdes.html (2005).

Rockwell Automation, "IEC 1131 Sequential Function Charts," retrieved online at http://www.software.rockwell.com/corporate/reference/lec1131/sfc.cfm (2007).

Siegmund, Robert et al., "Efficient Modeling and Simulation of Data Communication Protocols in Communication-oriented Designs using the SystemC$^{SV}$ Extension," retrieved online at http://www-ti.informatik.uni-tuebingen.de/~systemc/Documents/Presentation-4-UP5_siegmund.pdf (2001).

SIMUL8 Corporation, "SIMUL8 Feature Tour," retrieved online at http://www.simul8.com/products/features/ (2005).

SIMUL8 Corporation, "SIMUL8 Professional—Normally $4995 but $3995 til 31st May," retrieved online at http://simul8-online.com/products/s8prof.htm (2005).

Grötker, Thorsten "System C™, Transaction Level Modeling with SystemC," *Synopsys, Inc.*, retrieved online at http://www.google.com/search?hl=en&q=grotker+SystemC%2C+Transaction+Level+Modeling+with+SystemC&aq=f&oq=&aqi= (2002).

The MathWorks, "Stateflow and Stateflow Coder, For Complex Logic and State Diagram Modeling," User's Guide, Version 5 (2003).

* cited by examiner

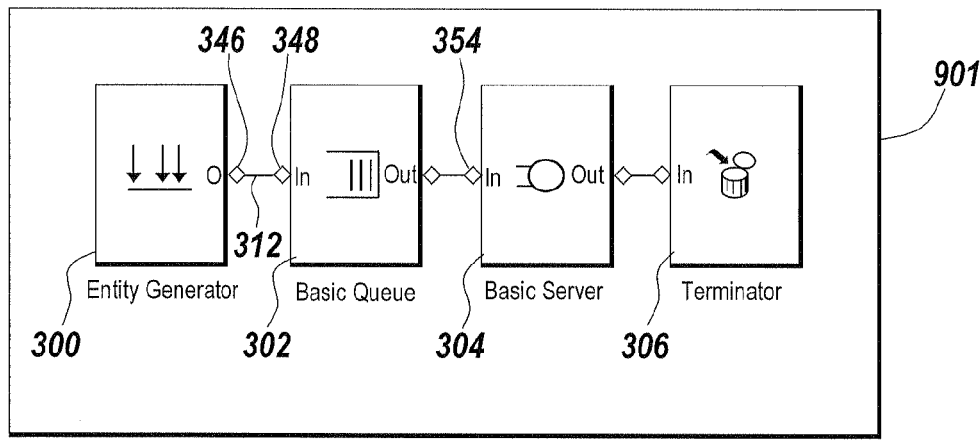
*Fig. 8*
| Time of Event (s) | Type of Event |
|---|---|
| 0.9 | Entity Generator block generates an entity |
*Fig. 9*
| Time of Event (s) | Type of Event |
|---|---|
| 1.7 | Entity Generator block generates second entity |
| 2.2 | Basic Server block completes service on the first entity |
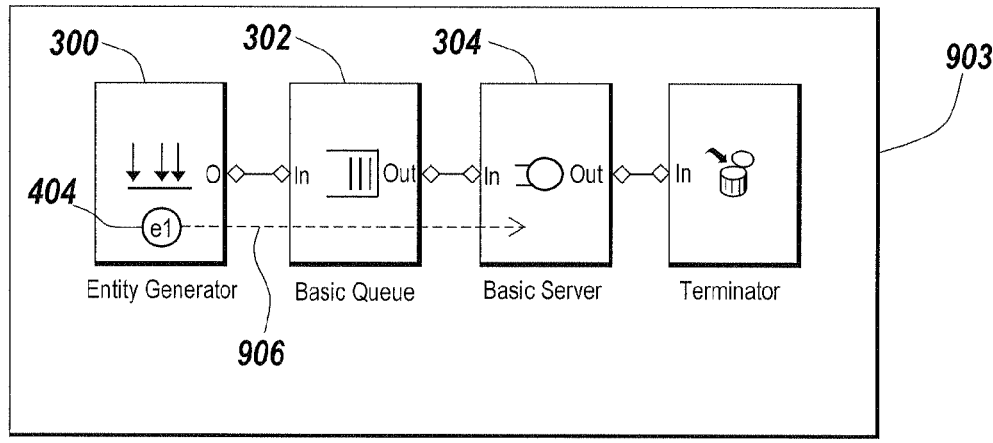
*Fig. 10*

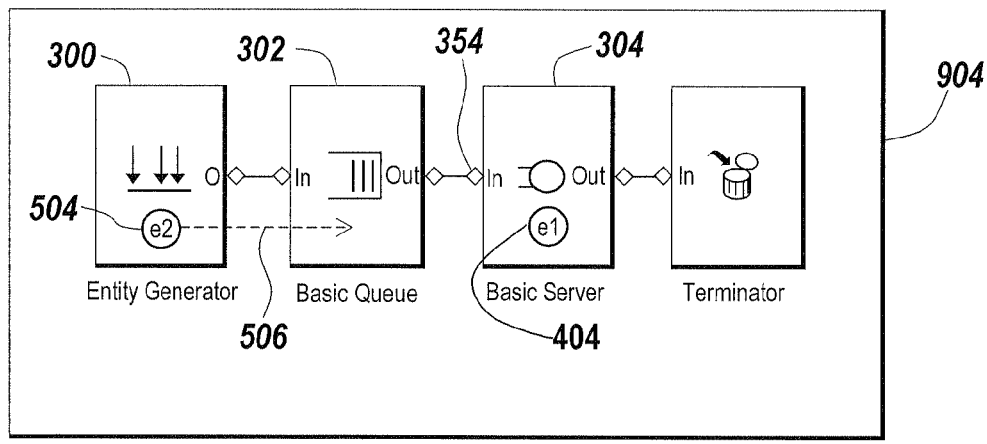
*Fig. 11*
| Time of Event (s) | Type of Event |
|---|---|
| 2.2 | Basic Server block completes service on the first entity |
| 3.8 | Entity Generator block generates the third entity |
*Fig. 12*
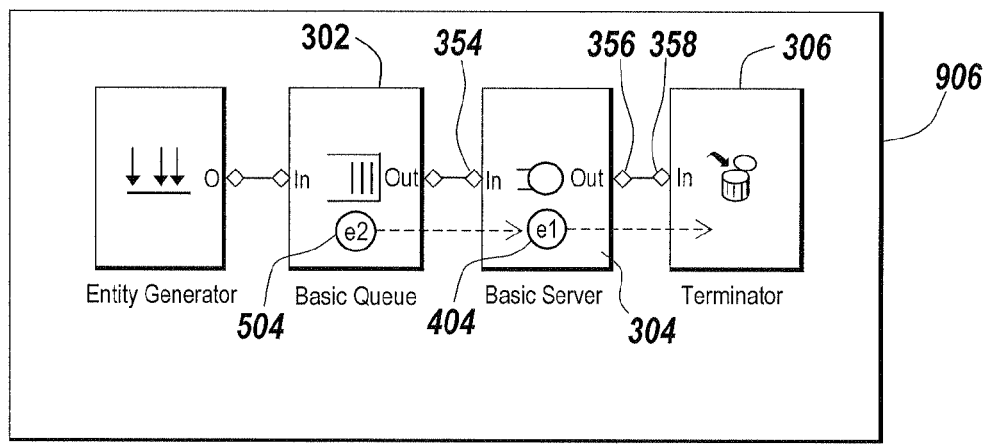
*Fig. 13*

| Time of Event (s) | Type of Event |
|---|---|
| 3.8 | Entity Generator block generates the third entity |
| 4.2 | Basic Server block completes service on the second entity |

| Time of Event (s) | Type of Event |
|---|---|
| 3.9 | Entity Generator block generates the fourth entity |
| 4.2 | Basic Server block completes service on the second entity |

| Time of Event (s) | Type of Event |
| --- | --- |
| 4.2 | Basic Server block completes service on the second entity |
| 6 | Entity Generator block generates the fifth entity |

| Time of Event (s) | Type of Event |
|---|---|
| 4.9 | Basic Server block completes service on the third entity |
| 6 | Entity Generator block generates the fifth entity |

*Fig. 19*

| Time of Event (s) | Type of Event |
|---|---|
| 2.1 | Entity Generator block generates the first entity |
| 2.1 | Entity Generator block generates the second entity |
| 2.3 | Basic Server block completes service |

*Fig. 20*

| Time of Event (s) | Type of Event | Priority |
|---|---|---|
| 2.1 | Entity Generator block generates the first entity | 1 |
| 2.1 | Entity Generator block generates the second entity | 2 |
| 2.3 | Basic Server block completes service of third entity | 3 |

*Fig. 21*

METHOD AND SYSTEM FOR TRANSFERRING DATA BETWEEN A DISCRETE EVENT ENVIRONMENT AND AN EXTERNAL ENVIRONMENT

RELATED APPLICATIONS

The present application is a continuation of copending U.S. patent application Ser. No. 11/024,148, which was filed on Dec. 21, 2004 by Michael I. Clune for a METHOD AND SYSTEM FOR TRANSFERRING DATA BETWEEN A DISCRETE EVENT ENVIRONMENT AND AN EXTERNAL ENVIRONMENT, and which claims priority to U.S. Provisional Patent Application Ser. No. 60/611,571, filed Sep. 20, 2004 for all subject matter common to both applications. The disclosure of the above-mentioned applications are hereby incorporated by reference herein in their entirety.

TECHNICAL FIELD OF THE INVENTION

The present invention relates to the transferring of data from a Discrete Event modeling environment to other modeling environments, as well as the transfer of data from a non-discrete event modeling environment to a discrete event modeling environment. Data transferred between a Discrete Event modeling environment and another modeling environment must take into account the timing and data management differences between various modeling environments such that data can be imported, exported, or both in a useable manner.

BACKGROUND

Generally, graphical analysis, simulation, and execution methods are used in modeling, design, analysis, and synthesis of engineered systems. These methods provide a visual representation of a model, such as a block diagram. The visual representation provides a convenient interpretation of model components and structure. The visual representation also provides a quick intuitive notion of system behavior. The components of a block diagram can also capture the mathematical representation of the actual system being modeled.

Historically, time-based block diagram models have been used in scientific areas, such as Feedback Control Theory and Signal Processing. Time-based block diagrams are used to study, design, debug, and refine dynamic systems representative of many real-world systems. A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), biochemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, and the like.

Professionals from diverse areas such as engineering, science, education, and economics build mathematical models of dynamic systems to better understand system behavior as it changes with the progression of time. The mathematical models aid in building better systems, which can be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may serve to educate users on the basic principles governing physical systems. The models and results are often used as a scientific communication medium between humans. The term "model-based design" refers to the use of models, often graphical, in the analysis, development, validation, and operation of dynamic systems.

Dynamic systems are typically modeled in modeling environments as sets of differential, difference, and/or algebraic equations. At any given instant of time, these equations may be viewed as relationships between the system's output response ("outputs"), the system's input stimuli ("inputs") at that time, the current state of the system, the system parameters, and time.

Time-based block diagram modeling has become particularly attractive over the last few years with the advent of software packages to process large amounts of data and perform a high number of computational iterations. In fact, various classes of graphical models enable a user to describe a system and related computations that can be performed on application specific computational hardware, such as a computer, microcontroller, FPGA, or custom hardware. Classes of such graphical models include time-based block diagram execution applications such as Simulink® from the MathWorks, Inc. Natick, Mass., and state-based flow diagram execution applications such as Stateflow® from the MathWorks, Inc. Natick, Mass., in addition to other models such as data flow diagrams, Unified Modeling Language (UML) models, VHDL models, analog extension models, and the like.

A common characteristic among these various forms of model execution applications is that they define semantics of how to execute the model diagram, and thus they specify how to model a dynamic system. Such applications provide sophisticated software platforms with a rich suite of support tools that make the analysis and design of dynamic systems efficient, methodical, and cost-effective. Furthermore, such applications can support the modeling of linear and nonlinear systems. These systems may be modeled in continuous time, sampled (or discrete) time, or a hybrid of continuous and discrete time. Systems can also be multirate, i.e., have different parts that are sampled or updated at different rates.

Time can be an inherited component of model diagram execution applications in that the results of a model diagram execution are dependent on time and as such, vary with time. In other words, a model diagram execution or model represents the instantaneous behavior of a dynamic system and models that system over time. Determining a system's behavior over time requires repeatedly executing a model of the system at intervals, called time steps, from the start of the time span to the end of the time span.

Systems may be categorized by the type of time step being used (fixed-step or variable-step). A fixed-step system is one that uses a fixed-step solver. A variable-step system is one that uses a variable-step solver. A solver is a module of the execution engine that is responsible for performing two tasks: (1) determining how far execution time should be advanced between consecutive passes through a system in order to accurately trace the system's outputs, and (2) integrating the derivative of the states of the system to obtain the actual states. Based on how solvers perform the first task, they are generally classified into two basic classes: Fixed-step solvers or Variable-step solvers. Fixed-step solvers often use explicit methods to compute the next continuous state at fixed periodic intervals of time. A variable-step solver can use either implicit or explicit methods to compute the next continuous state at non-periodic intervals of time. Generally, variable-step solvers use a form of error control to adjust the interval size such that the desired error tolerances are achieved.

Solvers can also be categorized into two classes with respect to time: continuous-time solvers and discrete-time solvers. Continuous-time solvers use numerical integration to compute a model's continuous states at the current time step from the states at previous time steps and the state derivatives. Continuous-time solvers rely on the model's blocks to compute the values of the model's discrete states at each time step. Mathematicians have developed a wide variety of numerical integration techniques for solving the ordinary differential equations (ODEs) that represent the continuous states of dynamic systems. Continuous-time solvers can further be separated into fixed-step continuous-time solvers and variable-step continuous-time solver. Discrete-time solvers exist primarily to solve purely discrete models. They compute the next execution time step for a model and nothing else. Discrete-time solvers do not compute continuous states and they rely on the model's blocks to update the model's discrete states. Similarly, discrete-time solvers can also be further separated into fixed-step discrete-time solvers and variable-step discrete-time solvers.

Simulink® is an example of an interactive graphical modeling tool that enables users to quickly create, model, simulate, and test block diagram representations of dynamic systems. Simulink® uses time-dependent models. It is suitable for simulating time-varying systems. FIG. 1 shows an example of a Simulink® model. The Simulink® model makes use of blocks and arrows to connect the blocks, when forming the model. Each arrow connecting one enabled block to another represents a signal having a value at all times. The arrow indicates which blocks read from the signal and write to the signal as the signal varies with time.

In time-based models, in order to know what happens with the system at a specific time in the future (such as at time equals 1000 seconds) the model must be initiated at a time of n seconds, where n is less than 1000 and the behavior at time n is known, and stepped through time to arrive at the 1000 second mark. For example, the model can be executed as follows in accordance with one example implementation embodiment. Input signal 100 generates an input signal. Link 114 connects the signal from the Integrator block 104 as determined by the state of the Integrator block 104 to a Scope block 108 for display, and also connects the signal to Gain block 106 through 114. At execution start time, the state of the Integrator block 104 has a user-defined initial value or a default initial value. Gain block 106 performs calculation on the input signal from link 114 and outputs the result on link 116 that connects to the Sum block 102. Sum block 102 adds the signal from link 110 and link 116 and outputs the result in the form of link 112. Integrator block 104 takes the signal from link 112 and performs integration on the input signal and updates its state accordingly. The model continues on operating on the updated state until a predetermined condition is achieved, a time period is attained, or the user interrupts the execution.

Dynamic systems can also be modeled from a state-based perspective. The state of the system may be thought of as a symbolic representation of the dynamically changing configuration of the system. For instance, in a model of a perfect nonelastic collision between two bodies, the state may be viewed as either the configuration where the two bodies are separated or the configuration where they are in contact. The system parameters are the numerical representation of the static, or unchanging, configuration of the system and may be viewed as constant coefficients in the equations modeling the system. For the nonelastic collision example, a parameter is the mass of one of the bodies.

Stateflow® is an example of a state-based dynamic system modeling application. Stateflow® is configured as a tool in Simulink® that can be used to design embedded systems that contain control, supervisory, or mode logic. By using Stateflow® with Simulink®, users can create models that combine state transition behavior (for example, fault detection or mode switching) with algorithmic continuous-time and discrete-time behavior (for example, feedback control or signal conditioning). Users can also create a model of the system and its environment in Simulink® and run hybrid executions to study the interactions between the two.

In Simulink®, a Stateflow® block uses a state transition diagram to represent an object with a discrete set of modes. These modes are known as states. A Stateflow® chart is a graphical representation of a finite state machine where states and transitions form the basic building blocks of the system. Stateflow® charts enable the graphical representation of hierarchical and parallel states and the event-driven transitions between them. The Stateflow® finite state machine reacts to events by changing states for the controlled object. A controlled object can be a motor, a pump, or any device that changes its behavior in response to external stimuli. The behavior of the object depends on what state the object is in and how the object changes from one state to another.

In the specific example application Stateflow®, the modeling process for modeling state-based executions, is embedded in Simulink®. Thus, the execution is invoked by Simulink® or some other time based dynamic modeling application, and does not run independently. In the case of Stateflow®, as execution starts, Simulink® starts its clock. When the execution engine reaches a Stateflow® block, the Simulink® clock stops evolving, and the execution engine passes information to Stateflow®, and awaits a signal back from Stateflow®. Stateflow® then performs its state-based modeling process. Once all the Stateflow® blocks finish their execution, outputs are sent to Simulink®, and the Simulink® clock starts ticking again. Therefore, during the execution of Stateflow® blocks, the execution is instantaneous, i.e., has no time effect on the Simulink® model. All the events and state transitions that occur in Stateflow® are considered to have taken place at the specific moment in time when the clock stops.

An example of a Stateflow® form of a state diagram model is shown in FIG. 2. Each arrow in the Stateflow® diagram also has values like the Simulink® arrows, but these values represent a decision value relating information that can cause one state to transition to another. The arrows in Stateflow® indicate the direction of the state transition. The exemplar Stateflow® diagram as shown in FIG. 2 is embedded in a Simulink® environment as shown in FIG. 3. The Simulink® signals are provided to Stateflow®, and Stateflow® uses this information to decide whether there are changes in states.

More specifically, in operation, a state flowchart 136 diagram is shown in FIG. 2, which corresponds to a detailed description of the flowchart 136 shown in FIG. 3. In FIG. 3, port data temp 158 receives a signal from the output of physical plant 146. Port temp_min 156 receives a value from a constant block 144 in Simulink® as the minimum set point temperature for the physical plant. Data switch 150 receives data from Simulink® constant block 140 or 142 indicating whether the switch should be on or off. Output port speed 160 on the state flowchart is then calculated based on input values 154, 156, and 158. Physical plant 146 receives data from output port speed 160 for further calculations within the physical plant 146. Within the state flowchart 136 as shown in FIG. 2, there are two states: an on state 120 and an off state 122. The default transition 126 determines that the initial state is the off state 122. When an on_switch transition 130 is enabled, the enable transition passes to junction 124 and determines whether the temp 158 data is greater or equal to 30, if not, then the enable transition is passed on to transition 132 and further finish the transition to the on state 120. Now the on state 120 is active and off state 122 inactive. The off state 122 will become active again when the off_switch transition 128 is enabled, at which time the on state 120 will become inactive.

One notable difference between Simulink® (and similar dynamic modeling programs) and Stateflow® (and similar state modeling programs) is that Stateflow® models state changes in response to discrete events and is implemented within the time-driven environment, whereas Simulink® is modeled in continuous time or discrete time and is the time-driven environment. Said differently, Simulink® is a time-driven engine and Stateflow® is an event-driven engine embedded and initiated in a time-driven environment.

Dynamic systems are typically modeled in execution environments as sets of equations. At any given instant of time, the equations output values that can be considered states, and can also be communicated to state flow modelers. Thus, users conventionally have the ability to model using time-driven equations, and/or event-driven models controlled by time-driven equations. For example, if a user wants to know how fast a school bus is traveling at a specific moment in time, the user can use Simulink® to model the speed of the school bus. If part of the determination of the speed is what gear the school bus transmission is in, the gear indication can be modeled in Stateflow® within the Simulink® speed model.

Stateflow®, and similar state modeling applications, are therefore utilized when the location and exact behavior of objects are not important but actions taken or completed on or by the objects are of interest. Such state flowchart models are currently invoked by the time driven dynamic modeling environments, such as that of Simulink®. Hence, if only a small number of Stateflow® calls are made by Simulink®, delays can be practically non-noticeable.

However, returning to the school bus example, if the user wants to know in the event of an emergency how fast the school children can get off the school bus, then the user must attempt a highly complex combination of time-driven equations and embedded event-driven models in time-driven environments to approximate the movement of each child off the bus. In Simulink®, such a model will also track the exact position of each child, despite the fact that whether a child has progressed one centimeter forward is not the focus of such a model. Regardless, such information must be tracked in the time dependent graphical model. Also, in such a model, the clock time that each child leaves the bus is unimportant. However, the number of children getting off the bus, the intervals between each child getting off the bus, and the position of the child as either remaining on the bus or being safely off the bus, are what is desired to be modeled. Such events are highly complex to model in time-driven model executions and state-based model executions operating in time-driven environments.

Furthermore, if a user wants to model network traffic and to determine how fast a router can relay millions of packets, it is computationally costly to use the state flowchart model within the dynamic block diagram time driven environment because such a configurations require constant calls between programs. Hence, the delay in execution output can be very noticeable, and can even approach the hardware processing limitations and bog down an execution to the point of ineffectiveness.

Accordingly, a modeling application that is event driven, and does not require a continuous time operation to execute, is desired.

SUMMARY OF THE INVENTION

The present invention generally relates to the transfer of information between various modeling environments in a model of a system, and more particularly relates to the transfer of data between a discrete event model environment and an external model environment other than a discrete event model environment.

In accordance with a first aspect of the present invention, a method of transferring data between a plurality of environments is provided. In accordance with the present embodiment, a first environment is provided wherein the first environment is an event driven discrete event model environment. This event driven discrete event model contains at least one entity that passes through said model. Additionally a distinct second environment distinct from the first environment is further provided. Furthermore, in accordance with the present embodiment, a gateway interface is implemented, such that said interface modifies data compatible with the discrete event model environment such that it is compatible with the second environment.

In accordance with an alternate embodiment, a system for transferring data between a plurality of model environments is recited. The system includes a first discrete event environment, and a second environment distinct from the first discrete event environment. Additionally, a gateway interface is provided wherein the gateway interface is in communication with the first environment and the second environment such that data can be transferred between the two environments. In various aspects of the present embodiment, the second environment can be a time based model environment, a state based model environment, a general event-driven model environment, a dataflow based model environment or some combination thereof.

In accordance with an alternate embodiment of the present invention, an interface mechanism for transferring data between a discrete event model and a distinct environment is provided. The interface includes a gateway block that is in communication with both the discrete event model environment and the distinct environment. Furthermore the system includes a conversion utility associated with the gateway block such that the conversion utility produces a compatible signal for use in establishing communication between the discrete event mode and the distinct environment

BRIEF DESCRIPTION OF FIGURES

The illustrative embodiment of the present invention will be described below relative to the following drawings.

FIG. 8 is an illustrative embodiment of a Discrete Event model environment.

FIG. 9 is an illustrative representation of the Event calendar for use with the present invention.

FIG. 10 is an illustrative embodiment of the event calendar and system model of the present invention.

FIG. 11 is an illustrative embodiment of a Discrete Event model environment.

FIG. 12 is an illustrative embodiment of the event calendar and system model of the present invention.

FIG. 13 is an illustrative embodiment of a Discrete Event model environment.

FIG. 19 is an illustrative embodiment of the event calendar of the present invention.

FIG. 20 is an illustrative embodiment of the event calendar of the present invention.

FIG. 21 is an illustrative embodiment of the event calendar containing priority data for use with the present invention.

DETAILED DESCRIPTION

Therefore it is desired to provide a modeling environment that can model the occurrence of events independent of continuous model time. A discrete event system (DES) modeling environment is one wherein the system's state transitions depend on asynchronous discrete incidents called events. Such a model execution differs greatly from a time based model environment, such as Simulink®, wherein the execution of the model is time driven.

Figure 1:
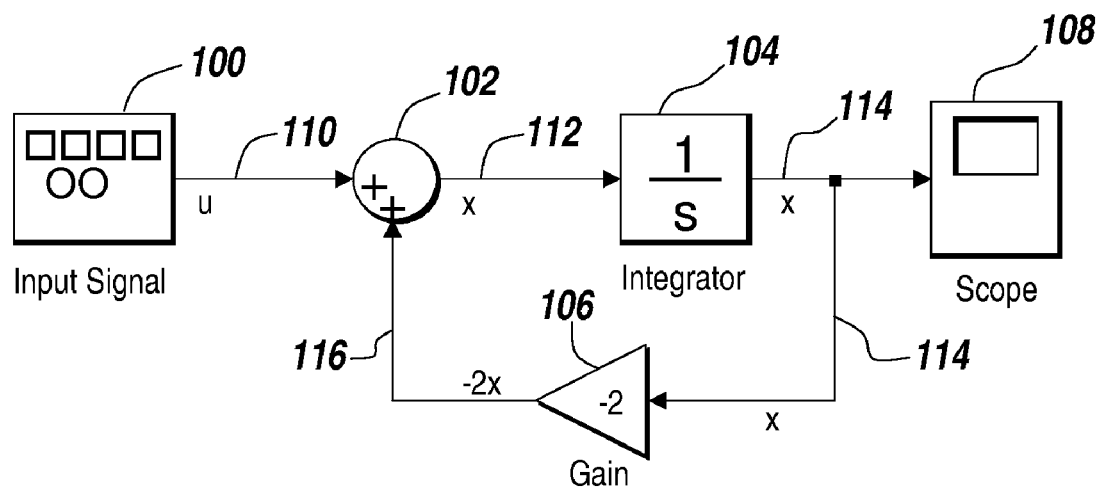
FIG. 1 is an illustrative embodiment of a Simulink® model.
Figure 2:
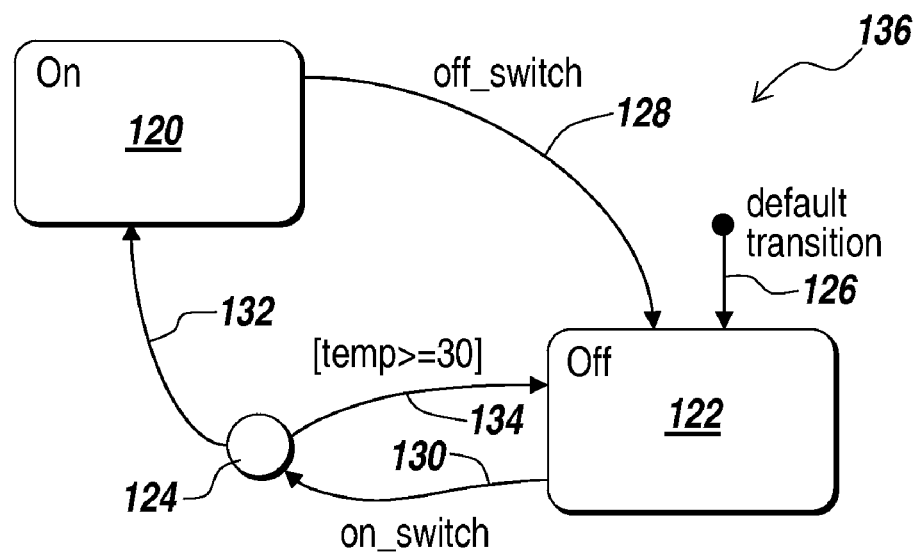
FIG. 2 is an illustrative embodiment of a Simulink® model.
Figure 3:
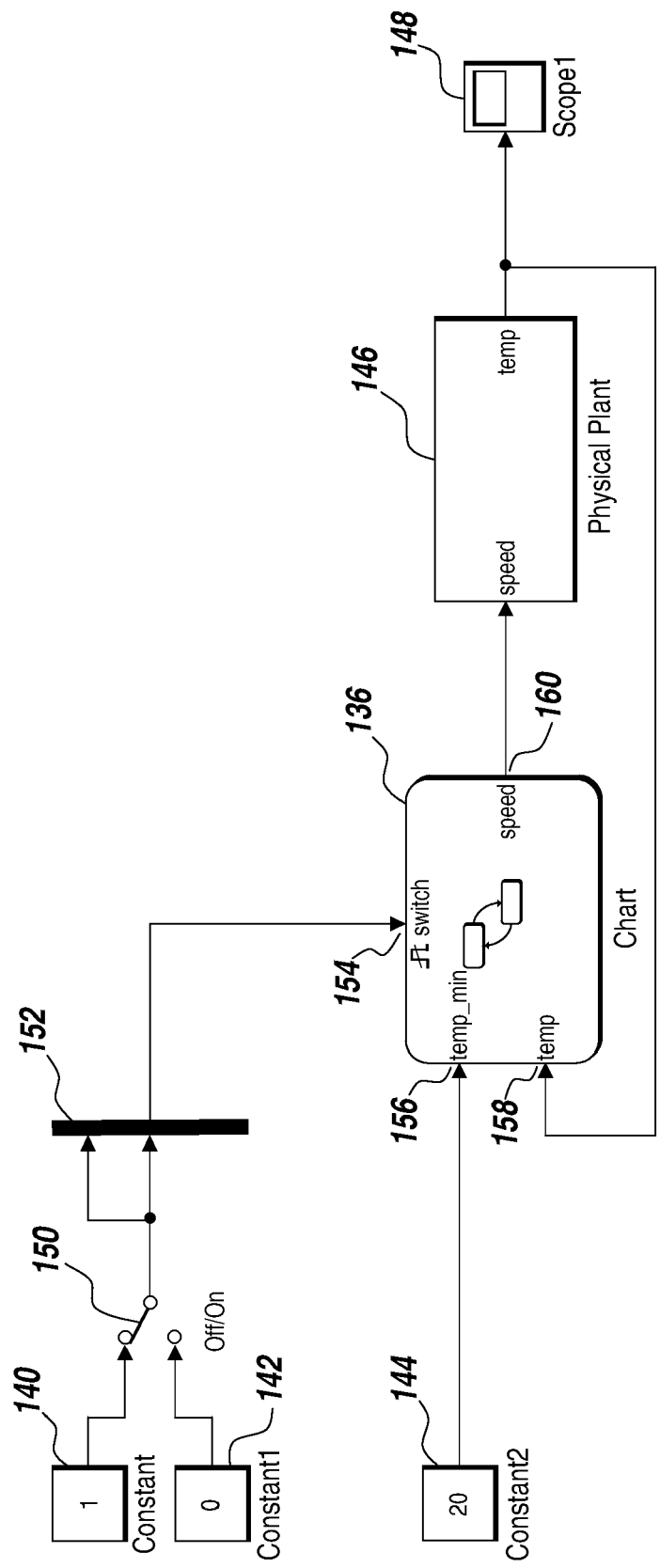
FIG. 3 is a hybrid external environment.
Figure 4:
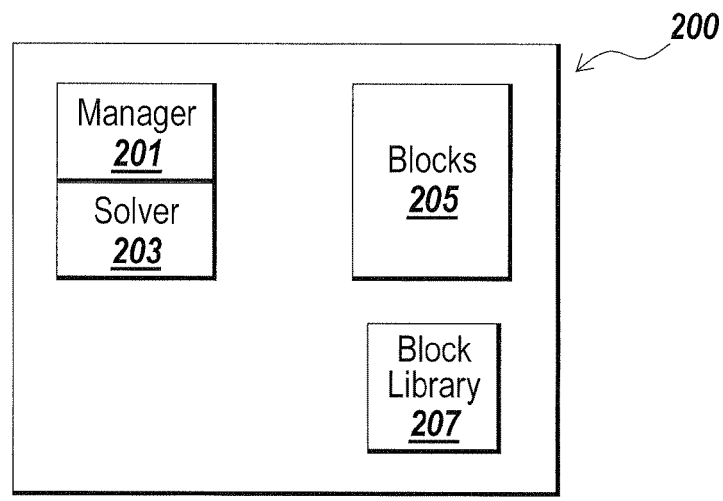
FIG. 4 is an illustrative example of a Discrete Event model environment for use with the present invention.

In reference to FIG. 4, a DES model environment 200 is provided. The DES model environment 200 includes an event modeling manager 201. The manager 201 coordinates the operation of the DES model environment to process model executions. The manager 201 includes a solver 203, which processes the DES model configured in the DES model environment 200. The manager 201 provides for the implementation of the DES model environment 200 by supporting the creation of DES blocks 205 that represent various aspects of the DES model. The blocks 205 can represent different portions of the model as later described herein. Example blocks include an entity generator, a queue, a server, and a terminator, in addition to other blocks having specific tasks and implementations. A block library 207 can be provided that is customized for operation within the DES environment. Furthermore, the block library in the present DES modeler is not industry specific, thereby providing for numerous user-defined applications.

A primary data component within the DES model is referred to as an entity. Entities are abstract representations of areas of interest within the DES model and may vary depending upon that which is being modeled by the DES system. Entities are the items that pass from block to block in the DES modeling environment. For example, when modeling a digital network, an entity may represent a data packet. In another example, when modeling a manufacturing plant, entities may take the form of individual items on the assembly line. Each DES model has at least one entity within the model.

The blocks 205 are interconnected using block connectors that pass entities and other information between blocks. The information can include information from other models or data sources or references that have some contribution to the creation or operation of the entities as they pass through the DES model. The blocks can also have block connectors that pass information out to other models or data sources outside of the DES model.

In operation, the DES model environment 200 makes use of the various blocks to organize and manipulate entities through the DES model. For example, the manager 201 manages the configuration of multiple blocks 205 to form the DES model. Blocks 205 can be placed in the model for entity generation, subsequent entity manipulation, and eventually entity termination. The basic operation of the DES model involves passing the entities through the blocks according to instructions governed by the manager 201 and solver 203. The manager 201 can be represented by an event calendar, wherein the event calendar serves to drive the DES model forward by executing the next scheduled event in the event calendar. The solver 203 in the present invention is a DES specific mechanism which allows for the execution of events in the DES event calendar in light of operations that can occur in the external environment. The solver 203 of the present invention, therefore, is in communication with the external environment and can notify the external environment of events within the DES environment which can affect the semantics of the external environment.

Nominally, an entity contains a set of attributes associated with the entity. However, an entity can contain as few as zero attributes. An attribute can be a field wherein the attribute is named and the attribute type is defined. For example, a field can define the entity type as a Boolean, a real number, an integer number, an enumerated type, a string, a vector, a matrix, a frame, and the like, such that the entity is of arbitrary data type. An arbitrary data type represents an arbitrarily complex structure containing data that may include hierarchical composition. The contained data can be as general as a single bit of information and any sequence of such bits representing characters, numeric values, or any other syntactic and semantic datum. Furthermore, an entity can contain sub-entities. Sub entities can be utilized in numerous operations such as recursive nesting or combining hierarchies.

The generation of entities can be automatic, or can be user-defined. User-defined entities allow users within a specific industry to define those attributes that are specific to their needs. The entity can then be incorporated into a DES model, thereby providing great user flexibility. Entities can further incorporate randomness into their behavior via probability distributions associated with blocks generating each entity. These probability distributions can be representative of the probability of an entity being generated based upon a set of defined variables. Probability distribution can be user defined or can be generated automatically, such that a probability of an event occurring drives entity generation within the model. Furthermore, the generation of a probability distribution may be accomplished utilizing other applications or environments, such as but not limited to the MATLAB® environment or the Simulink® environment.

It should further be noted that there can be a relationship between attributes and random numbers as well. When setting attributes of entities, the user can assign values based on input from separate environments, such as Simulink®, to attributes in passing entities. Such separate environments can allow the values to be drawn from a probability distribution. The separate environment thus allows the attributes to be assigned samples from random variables. These random values can be used to introduce randomness in a controlled way to other parts of the model when they move into those parts of the model.

Figure 5:
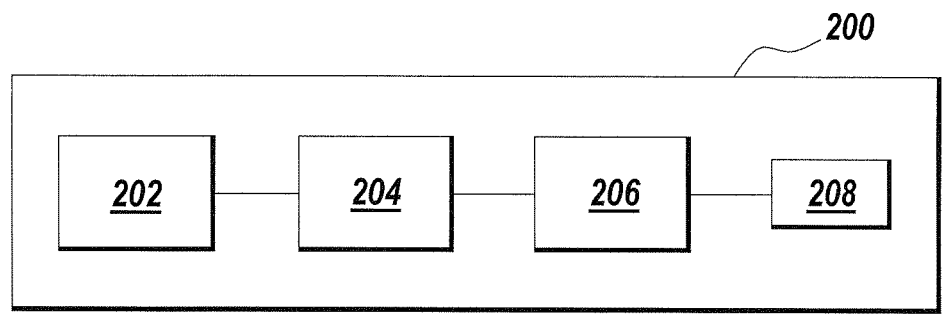
FIG. 5 is an illustrative embodiment of a Discrete Event model environment.

FIG. 5 depicts a sample DES model environment 200. The present DES model environment includes sources 202 and sinks 208 as depicted in FIG. 5. Sources 202 correspond to those blocks that allow data input into the model, while sinks 208 correspond to those blocks that remove entities from the model. A source 202 in a DES model can take numerous forms. A source 202 can be an entity generator that produces numerous entities at fixed time intervals. Another example of a source 202 is an external operating environment outside of the DES model. For clarity, this external operating environment is not shown on FIG. 5. However, as an example, Simulink® can be used as a source for the present DES modeler, wherein a Simulink signal can trigger the generation of an entity for use in the DES model based upon criteria set by a DES modeler user.

Sinks 208 in a DES model can have functions other than terminating entities, such as returning arbitrary values from entities. A DES sink 208 can display all of the attributes passed to it, or can display a defined set of variables. Sinks 208 for use in the DES modeler of the present invention can also take various forms. One example of a DES modeler sink 208 is a Terminator Block. The Terminator Block can be defined to accept all entities delivered to it, or in the alternative can block all or some entities delivered to it according to selected conditions. Another example of a possible form of sink 208 in the present DES modeler is a Scope Block. The Scope Block can accept an entity and plots data from the entity in a graphical manner. This graphical depiction can allow a user to closely monitor the status of the DES model as well as view numerous trends within the model graphically. A Display Block can also display selected attributes of an entity. Furthermore, a sink 208 in the present invention can be a block that allows the export of a signal from the DES model to an external environment. For example the DES modeler of the present invention can include a block that receives an entity and outputs a Simulink® signal that may be used in a Simulink® environment.

In the present invention, entities generally pass from sources 202 to sinks 208. Entities can, however, traverse numerous intermediate blocks 204, 206 on the pathway from source 202 to sink 208. These intermediate blocks 204, 206 can be represented by numerous specialized DES blocks within the block library of the present DES modeler.

These intermediate blocks can have the same functionality as described above for the sinks. For example, the intermediate blocks can display all of the attributes passed to them, or can display a defined set of variables. The intermediate blocks can have conditions to define which entities can pass through them. Scope Blocks can serve as intermediate blocks that accept an entity and plot data from the entity in a graphical manner. Display Blocks can also display selected attributes of an entity. Furthermore, the intermediate blocks can include blocks that export a signal from the DES model to an external environment, or import a signal or other input information from an external environment.

Figure 6:
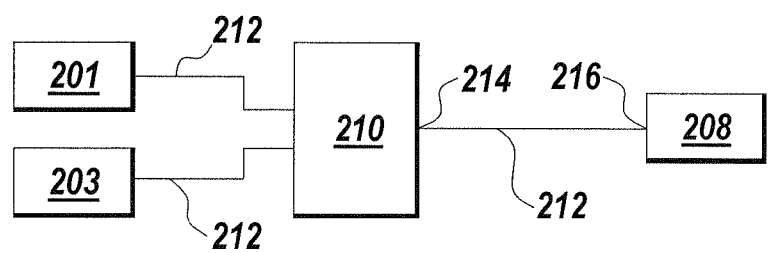
FIG. 6 is an illustrative embodiment of a Discrete Event model environment.

FIG. 6 depicts an example of an intermediate block utilized in accordance with one embodiment of the present invention. A Routing Block 210 may be placed between two source blocks 201, 203 such that only a subset of entities is passed to a sink block 208. The subset is determined by the logic of the Routing Block 210 and the data that it uses to determine the path from which the entity is allowed to arrive. Additional intermediate blocks that can be used in accordance with the present invention include, but are not limited to Logical Gates, Queuing Blocks, Storage Blocks, Routing Blocks, Execution Control Blocks, Server Blocks, Resource Allocation Blocks, Timer Blocks, Timeout Blocks, and Delay Blocks. Additionally, the DES environment allows for users to customize and define their own blocks specific to the problem they are modeling and the model they have developed.

The path that an entity takes through the DES modeler environment, as depicted in FIG. 6, is an entity path 212. The entity path 212 is any connection from an entity output port 214 to an entity input port 216 on a block within the DES modeler. For illustrative purposes, these entity paths are represented by a line connecting the entity input 214 and output ports 216 of blocks within the DES model environment. The entity path 212 in the DES model environment is active only when an entity is passing through the entity path 212. At times when there is no entity passing through the entity path 212 in the execution, the entity path has no value associated with it.

Further, there may be associated with each block in a DES environment a state, wherein the state is a persistent data set corresponding to the block. The state variable of a block contains a set of attributes associated with the block (i.e. a Boolean operation, string, parsable string array) and may contain a sub state variable for nesting and combining hierarchies.

Within the DES model of the present invention there can be numerous events. Events are instantaneous occurrences that change a state variable, an output, a future event or any combination thereof. Events are generated at any point at which a block within the DES model acts on an entity. Events can take numerous forms, but by example can include the creation of a new data packet in a network, the exit of a package from a loading dock or the placement of an item on a conveyor belt in a manufacturing plant. Each event within a DES model contains four specific characteristics associated with the event. Firstly, each event specifies an entity, namely a set of data associated with the event. Additionally, each event has time data associated with it, defining when the event is scheduled to occur. Events in a DES model can also have a priority associated with their execution, thereby defining the urgency of the event relative to other events that may occur at the same time. Finally, each event has a destination object associated with it, which serves to identify where the event is to take place. The destination object is typically a DES model block but can also be an entity.

Figure 7:
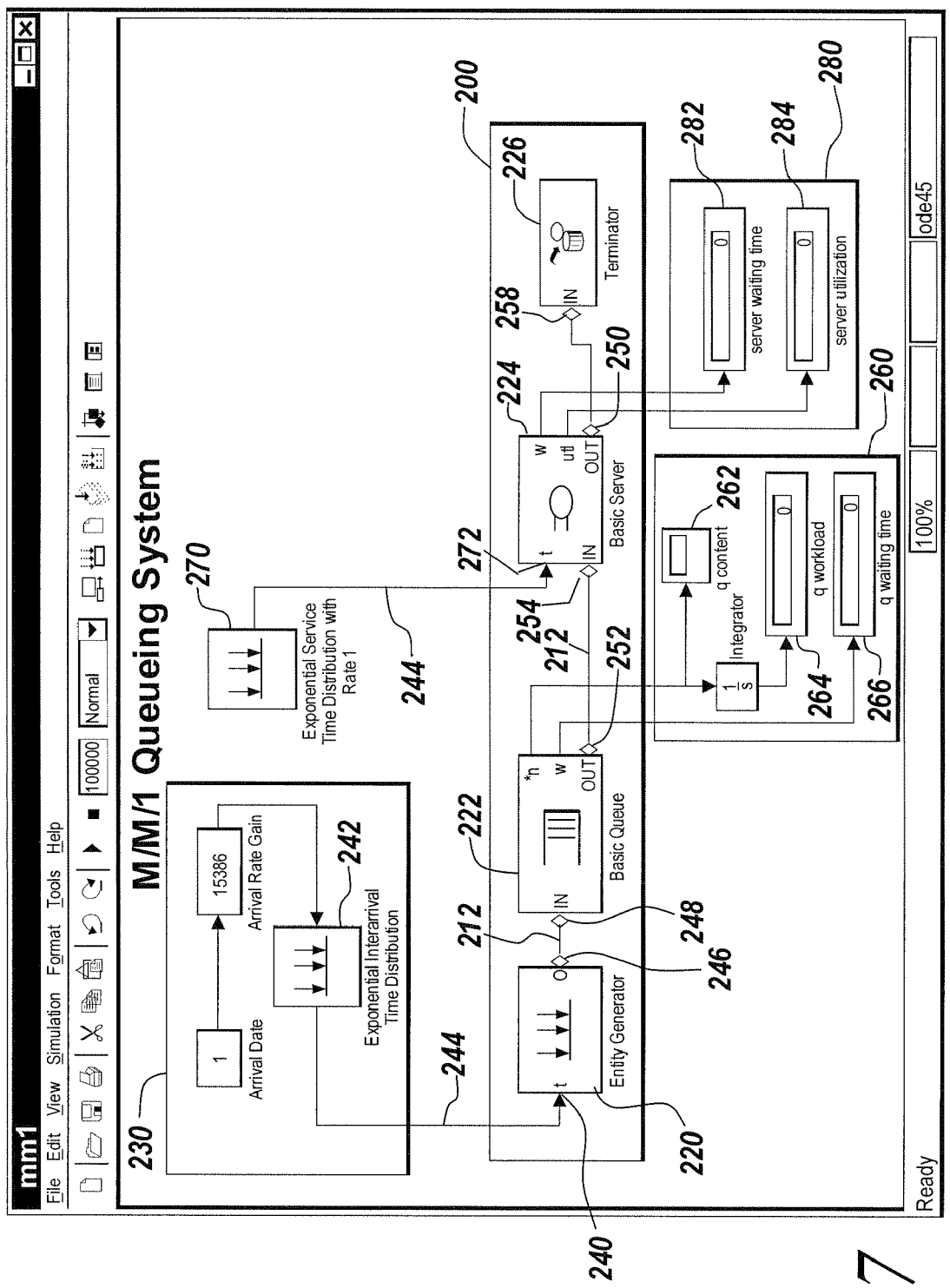
FIG. 7 is an illustrative embodiment of a Discrete Event model environment in communication with an external environment.

In FIG. 7, a DES environment 200 is denoted. The DES model is capable of communicating with external environments of various forms 230, 260, 270, 280 including such examples application as Simulink® and Stateflow®. In one embodiment, the DES model can receive data from these environments 230 and 270 as well as output data to these external environments 260, 280 in accordance with the needs of the user generating the model. Communication with the external environments 230, 270, 260, 280, however, is not necessary, as execution models may be created solely within DES environment that have no interface with environments beyond the DES environment 200.

An entity generator within the DES environment 220 can interface with an external environment 230, such as Simulink®, at port "t" 240 on the entity generator 220. The entity generator block 220 is an example of a source block within DES. The signal transmitted on signal path 244 and received at port "t" 240 is used to control the rate of entity generation by the entity generator 220. Associated with the signal on signal path 244 is a probability distribution provided by the Exponential Interarrival Time Distribution (Simulink®) subsystem 242 within the external environment 230. In light of this probability distribution, a varying signal is presented to the entity generator 220 resulting in the generation of entities in accordance with the probability distribution of the Exponential Interarrival Time Distribution (Simulink®) subsystem 242. Entities generated by the entity generator 220 are passed from the output port of the entity generator 246 to the input port of the queue block 248 over the entity path 212.

The queue block 222 accepts entities and is capable of forwarding them to further associated blocks. In the present example, the entities generated by the entity generator 220 can be forwarded to the server block 224 by the queue block 222 in accordance with user defined values. For example, a user may instruct the queue to hold no more than 10 entities for forwarding. When the queue block 222 has reached capacity, the input port to the queue block 248 may be temporarily disabled thereby preventing the introduction of any more entities to the queue block 222. In such a scenario, the input port of the queue block 248 is defined as unavailable. When the number of entities within the queue block 222 has decreased below the 10 entity limit, the input port to the queue block 248 can be made available, allowing the delivery of additional entities from the entity generator 220 to the queue block 222. Entities within the queue block 222 can be queued based upon the time at which they were generated by the entity generator 220, or can be queued based upon numerous other arrangements. For example, a priority may be associated with various entities, and the queue block 222 may queue entities based upon their priority. Furthermore, as exhibited in FIG. 7, the queue block 222 may interface with an external environment 260 outside of the DES model 200. As illustrated, the queue block 222 has been associated with a scope 262, a first display 264 and a second display 266, thereby allowing a user to graphically view that which is occurring within the queue block 222.

The queue block 222 of the illustrative embodiment can pass entities from the output port of the queue block 252 to an input port 254 of the associated server block 224. The server block 224 can accept entities delivered through the entity path 212 connecting the queue block output 252 to the Server Block input port 254. The Server Block 224 can delay a received entity for a time before passing it to the next associated block, namely the Terminator Block 226. The delay associated with a server is known as a "service time". Service time may be user-defined, or may be based upon an internally or externally generated value. For example, the example embodiment utilizes a Simulink® signal with an associated probability distribution in the Exponential Service Time Distribution with Rate 1 block 270. This results in a variable service time for the server block 224. This variable service time is provided to the Server Block 224 at port 272 of the server block via a signal line 244. While the server block 224 is busy, i.e. during the service time, the server block 224 will make its input port 254 unavailable, thereby preventing the reception of any additional entities. Upon expiration of the service time, the input port to the server block 254 will be made available, thereby allowing the passage of entities once again. Simultaneously, once the service time is completed, the server can pass entities from an output port of the server block 250 to a further associated block. In the present example, this block is a terminator block 226, which is a sink within the DES environment. The terminator block 226 can be user-defined to accept all entities passed to it, or may have other functionality defined by a user. For example, the terminator block 226 may be defined such that it blocks all entities delivered to it, or may produce an error message upon the arriving of an entity. The server block 224 of the illustrated embodiment can further be associated with an external environment 280 external to the DES model. As evidence in the example, the server block 224 can deliver a signal to a first graphical interface 282 and a second graphical interface 284 so that a user can monitor the internal operations of the Server block 224.

In a DES model environment, the DES solver is driven by ordered events, therefore time becomes a secondary variable in the execution. The order of events within a DES model is continually updated in response to changes in the model. Utilizing such an event-driven model, only those points at which an event is scheduled to occur need to be modeled. Time between events, namely "empty time" need not be modeled, thereby resulting in improved efficiency and decreased processor demand.

Events within a DES model are scheduled and managed using an Event Calendar. Unlike a time-based modeling environment, size of the time interval between events is simply the period of time between events. Using the Event Calendar, the DES model can determine when to update the states of certain block in the model, and can also infer when to save time by not updating states. An example of the application of the Event Calendar is best seen by example.

FIG. 8 is an example DES model for use in describing the Event calendar. Assume that the blocks are configured so that the Entity Generator 300 block generates an entity at various times, namely t=0.9 seconds, 1.7 seconds, 3.8 seconds, 3.9 seconds, 6 seconds. Further assume that the queue block 302 has a capacity of 20. Additionally, assume that the server block 304 uses random service times that are uniformly distributed between 0.5 seconds and 2.5 seconds. When the execution first starts, the queue block 302 and server block 304 are empty. The entity generator block schedules a first event at t=0.9 s. An illustrative example of the event calendar 900 at time t=0.9 is illustrated in FIG. 9. One skilled in the art will recognize that the described parameters are merely illustrative of one example, and that the model can generate any suitable number of entities at any suitable time, the queue block can have any suitable capacity and the server block can have any suitable service time.

At t=0.9 seconds, the entity generator block 300 of FIG. 8 creates an entity and attempts to output the entity from the entity generator output 346. Because the queue block 302 is empty, the entity advances from the entity generator block output 346 to the queue block input 348 over the entity path 312 in the model. Since the queue block 302 has no entity within it, the queue block 302 attempts to output the entity to the next block in the model, namely the server block 304. Because the server block 304 is empty, the entity advances from the queue block 302 to the server block 304. At this moment, the server's entity input port 354 is temporarily unavailable to future entities.

Upon receiving the entity, the server block 304 schedules an event that indicates when the entity's service time is completed. For the purpose of illustration, duration of service of 1.3 seconds is assumed. In light of this, service will be completed at a time of t=2.2 seconds, the sum of the time that the entity enters the server, and the service time.

As set forth previously, a second entity generation event is scheduled at t=1.7 seconds. The event calendar and the associated DES model 903 at a time of t=1.7 seconds is depicted in FIG. 10. The updated Event Calendar 902 is shown, as well as a graphical representation of entity status within the DES model. In FIG. 10, the element marked "e1" 404 signifies the first entity and the dashed arrow 906 serves to indicate the advancement of the first entity 404 from the entity generator block 300 to the queue block 302 and finally to the server block 304.

As evidenced in the Event Calendar at time t=1.7 seconds 902 of FIG. 10, a second entity is to be generated at a time of t=1.7 seconds.

FIG. 11 is an illustrative embodiment of the present invention at a time of t=1.7 seconds 904. At a time of t=1.7 seconds the entity generator block 300 will create an entity "e2" 504 and will attempt to output it. The queue block 302 is empty at this point in time, so the second entity 504 advances from the entity generator 300 to the queue 302 as illustrated in FIG. 11. The advance of the second entity 504 is depicted by the dashed arrow 506.

As depicted in FIG. 11, the newly generated entity "e2" 504 is the only one in the queue block 302. The queue block 302 will therefore attempt to output the second entity 504 to the server block 304. As entity e1 404 remains in the server block 304, the server block's input port 354 is unavailable to receive the second entity 504. The second entity 504 will therefore remain in the queue block 302 until the server becomes available.

FIG. 12 is an illustrative example of the event calendar at a time of t=2.2 seconds 905. Based upon the original assumptions, the entity generator block will schedule the generation of a third entity (e3) at a time of t=3.8 seconds.

FIG. 13 is an illustrative embodiment of the present invention at a time of t=2.2 seconds 906. At t=2.2 seconds, the server block 304 finishes serving the first entity 404 (i.e. service time is completed) and attempts to output the first entity 404 to the associated terminator block 306. The terminator block 306 is simply a sink that by definition accepts and absorbs all entities. In light of this, the first entity (e1) 404 advances from the server block 304 output port 356 to the terminator block 306 input port 358. As the first entity (e1) 404 advances, the server block's 304 entity input port 354 becomes available once again, allowing the queue block 302 to pass the second entity (e2) 504 to the server block 304 via the server block input port 354 via an entity path 212. Upon passing the second entity 504 to the server block 304, the queue block 302 is now empty and the server block 304 becomes busy again. As the server block 304 is busy, the server block's entity input port 354 becomes temporarily unavailable once again.

Figures 14, 15, 16:
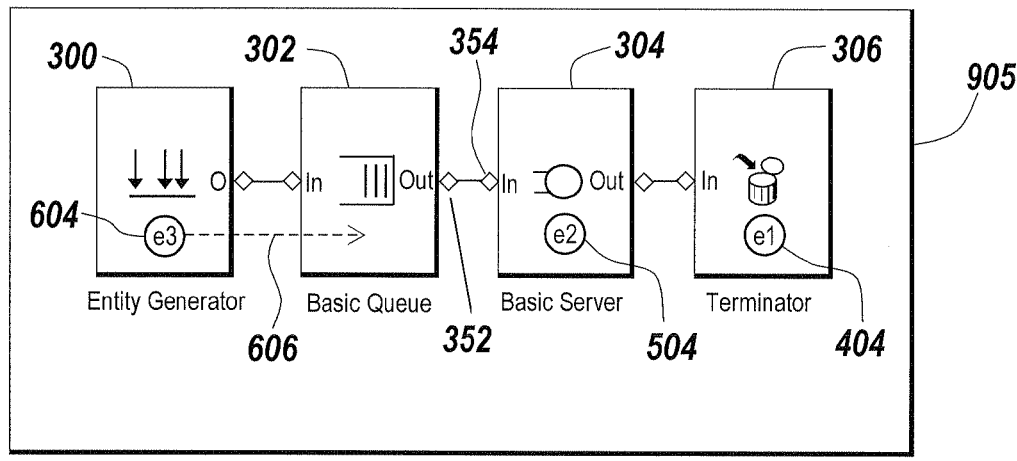
FIG. 14 is an illustrative embodiment of the event calendar and system model of the present invention.
FIG. 15 is an illustrative embodiment of a Discrete Event model environment.
FIG. 16 is an illustrative embodiment of the event calendar and system model of the present invention.

FIG. 14 is a depiction of the Event Calendar at a time of t=3.8 seconds 904. The event calendar at time t=3.8 seconds has been generated using the assumption that a service time of t=2.0 seconds has been established for the second entity.

FIG. 15 is a graphical depiction of the DES model at a time of t=3.8 seconds 905. At t=3.8 seconds, a third entity 604 will be generated by the entity generator block 300. The queue block 302 remains empty, so the third entity 604 advances from the entity generator 300 to the queue block 302. The advancement of the third entity 604 from the entity generator 300 to the queue block 302 is illustrated by the dashed line 606.

Because the third entity 604 is the only one in the queue block 302, the queue block 302 will attempt to output the entity to the server block 304. As set forth above, the server block's input port 354 remains unavailable due to the presence of the second entity 504 in the server block 304, so the third entity 604 will remain in the queue block 302. The queue block's 302 entity output port 352 is said to be blocked because an entity has tried and failed to depart via this port.

FIG. 16 graphically represents the event calendar at a time of t=3.9 seconds 906.

Figure 17:
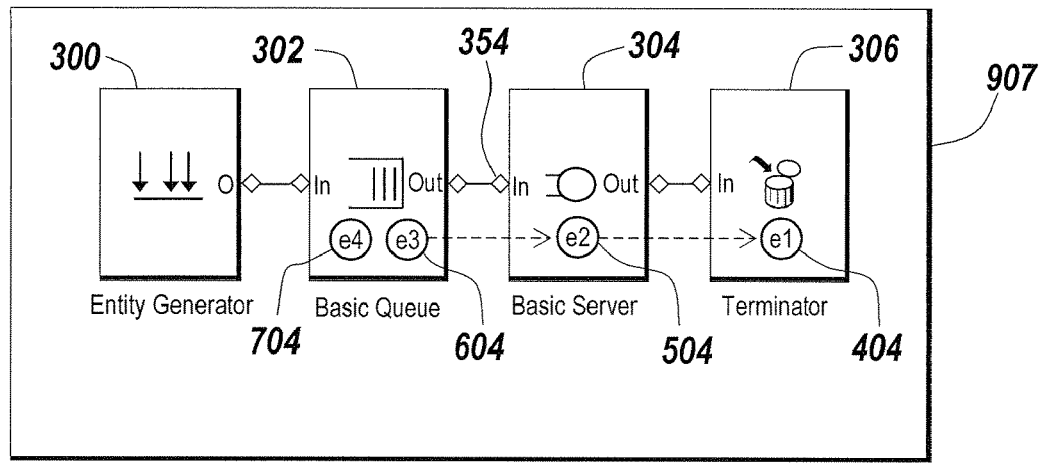
FIG. 17 is an illustrative embodiment of a Discrete Event model environment.

FIG. 17 is a graphical depiction of the present invention at a time of t=3.9 seconds 907. At t=3.9 seconds, the entity generator 300 schedules the generation of a fourth entity 704. The entity generator 300 will attempt to output the fourth entity 704 to the queue block 302. Since the queue block 302 is not full, the fourth entity 704 will advance from the entity generator block 300 to the queue block 302. The server block's entity input port 354 remains unavailable, therefore the queue block 302 cannot output the fourth entity 704 to the server block 304. The queue length within the Queue Block 302 is two, as depicted in FIG. 17.

Figure 18:
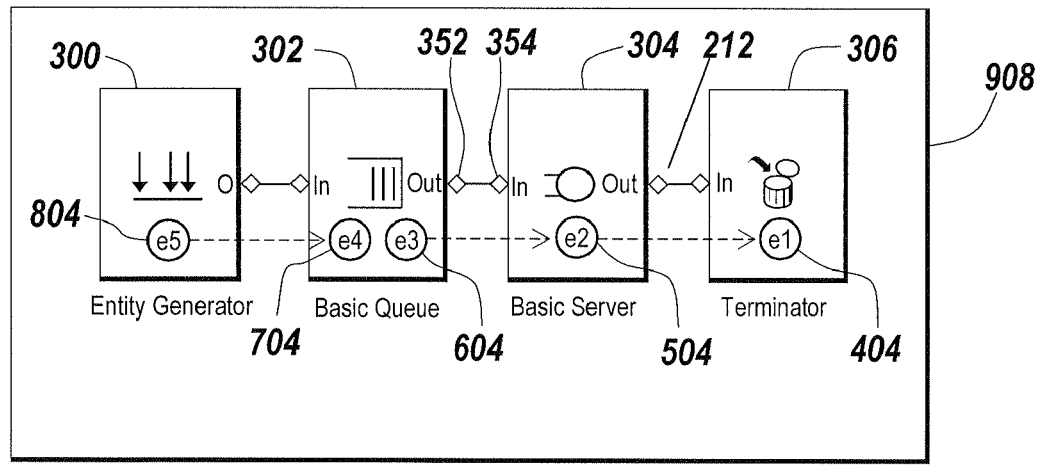
FIG. 18 is an illustrative embodiment of the event calendar and system model of the present invention.

FIG. 18 is a graphical depiction of the DES model 908 and event calendar 909 at a time of t=4.2 seconds. At t=6.0 seconds, a fifth entity 804 is generated by the entity generator 300. At time t=4.2 the server block 304 finishes serving the second entity 504 and attempts to output the second entity 504 to the terminator block 306. The terminator block 306 accepts the second entity 504 and the second entity 504 advances from the server block 304 to the terminator block 306 via a entity path 212. Additionally, the server block's entity input port 354 becomes available, so the queue block's entity output port 352 becomes unblocked. The queue block 302 is now able to output the third entity 604 to the server block 304. The queue length within the queue block 302 has decreased to only one entity, namely the fourth entity 704, and the server block 304 once again becomes busy. The server block's entity input port 354 again becomes temporarily unavailable. The server block 304 will schedule an event on the event calendar that indicates when the entity's service time is completed on the event calendar. For illustrative purposes, 0.7 seconds will be used. The event calendar at a time of t=4.9 seconds 909 is presented in FIG. 19.

The queue block 302 will attempt to output the fourth entity 704, but the server block's entity input port 354 is unavailable. In light of this, the fourth entity 704 remains in the queue block 302. At the same instant, the queue block's entity output port 352 becomes blocked, prohibiting further attempt to pass the fourth entity 704 to the server block 304 while the server block's input port 354 remains blocked.

Remaining entities within the illustrated model will pass through the model in accordance with the above steps as driven by the event calendar. Additional entities may be placed on the calendar by the entity generator block 300, or no additional entities may be generated and the execution will be complete upon the passage of the fifth entity 804 to the terminator block.

The defined times on the event calendar are inherently important within the DES modeling systems, as events on the event calendar serve as indicators of times at which the systems state is changing. In contrast, times between events on the event calendar are not important to modeling the system, in that at these times the system state remains unchanged. In light of this, the DES modeler skips the static periods and focus on the event times of the event calendar. Such an arrangement offers increased efficiency as compared to a fixed sampling interval.

Additionally, at defined times within the event calendar, multiple states can change instantaneously. For example, at time t=2.2, the server block 304 becomes idle and then busy again. Simultaneously, the queue length also changes because the queue block 302 outputs a second entity (e2) 504 to the server block 304.

The illustrative event calendar serves as a convenient example of event processing at discrete time intervals within the model. Inherent in advanced modeling of a system, however, is an occurrence of two or more events that are scheduled to occur at the same time instant. Such events are defined as "simultaneous" events and are depicted on a sample event calendar in FIG. 20. The sequential processing of these simultaneous events may be irrelevant or relevant to the execution results, therefore the DES modeler contains numerous methods for determining the proper processing sequence. One such method is the assignment of priority levels to the events.

In FIG. 21, priority values 830, 832 are assigned to the simultaneous events 820, 822 within the event calendar. The relative priorities among the simultaneous events therefore determine their processing sequence within the event calendar. Using a priority value associated with simultaneous events allows a user to decide how various events are related to each other. However, this approach might be inappropriate if a deterministic approach produces a bias that inaccurately reflects the phenomena that a user is modeling. In light of such concerns, a random sequence may be utilized. The random sequence for executing simultaneous events offers the advantage of eliminating bias in the execution, but results in the non-repeatability of the execution should a user run the execution more than once, assuming random number seeds are not utilized.

The DES model of the present invention allows for the transfer of information to various block within the DES model environment, as well as to environments outside of the DES model. For example, as indicated in FIG. 7, the use of a terminator block as a sink may allow for acceptance of all entities within the model. In place of or in conjunction with the terminator block, a scope block may be utilized to accept an entity and plot data from an attribute of the entity. Data plotted may include a plot of information related to entities experiencing a discrete event or a discrete state. Utilizing a scope block a user can visually verify the operation and performance of a DES model. Additionally, a display block may be associated with the DES model such that the value of an attribute of an entity is graphically displayed. The DES model of the present invention further includes blocks that allow the export of entity attribute values to regions outside of the DES model environment. For example, individual entity priority data may be exported to an external modeling environment such as Simulink®. Control of export of data from this block can take place within the DES model environment, can be controlled by an external environment, or can be a combination of both. In light of this, when modeling complex systems, the DES model of the present invention can be incorporated into other modeling, execution, and display applications. In the alternative, the DES model of the present invention can operate in a stand alone configuration, wherein a system to be modeled is modeled solely within the DES model environment.

Figure 22:
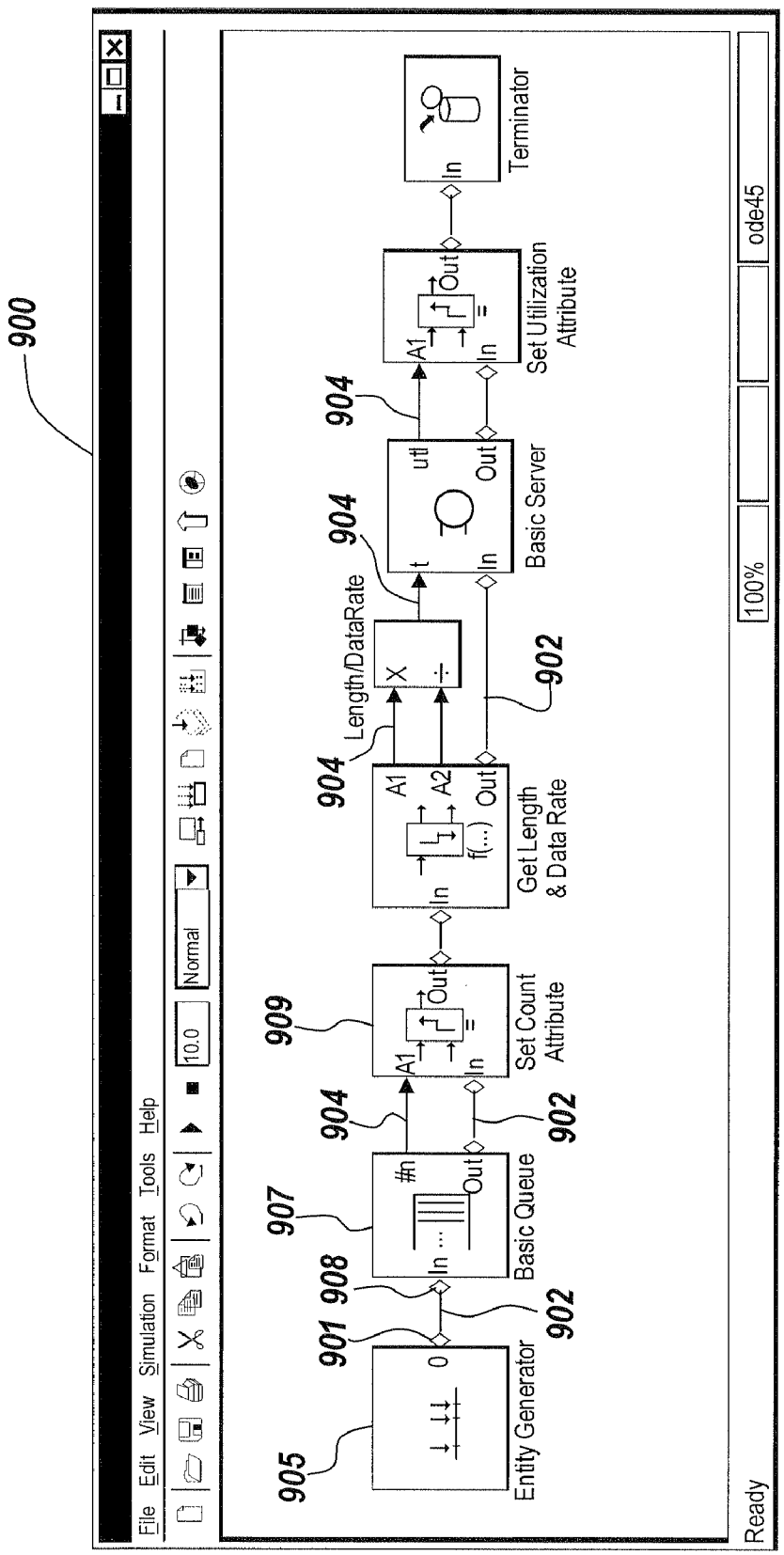
FIG. 22 is an illustrative view of a block diagram model for use in accordance with the present invention.

The present invention discloses a method and system for transferring data between a discrete event system (DES) environment and a second environment distinct from the DES environment. A broad overview of the integration of both environments and the transfer of information between these environments is illustrated in FIG. 22. FIG. 22 illustrates a hybrid model environment 900 wherein a DES environment operates simultaneously with a second environment external to the DES environment. For illustrative purposes, entity paths 902 between DES blocks are denoted by connectors bearing diamond shaped endpoints. An example of such an entity path 902 can be seen between the output port 901 of the entity generator 905 and the input port 908 of the Basic Queue block 907. These entity paths 902 only have data values when an entity is passing through them.

In contrast, data signals external to the DES environment are evidenced by signal paths 904 bearing an arrow shape. One of ordinary skill in the art will appreciate that the use of an arrow-shaped signal path is merely representative and these signal paths can take the form of numerous other embodiments. An example of a signal path 904 is a data signal within a time based model environment. The arrow indicates which blocks read from the signal and write to the signal as the signal varies with time. The variable nature of the signal in relation to time differs from the presence of data within an entity path 902 only when an entity is passing through it.

As illustrated in FIG. 22, the Basic Queue block 907 transfers both an entity over the entity path 902, as well as a data signal over the data signal 904 path to the Set Count Attribute block 909. The hybrid combination of both a DES model as well as an alternative environment that is not a discrete event system offers a user the ability to analyze a dynamic system with the most appropriate tools necessary for the model evaluation, as opposed to being restricted by the constraints of a single model environment.

Figure 23:
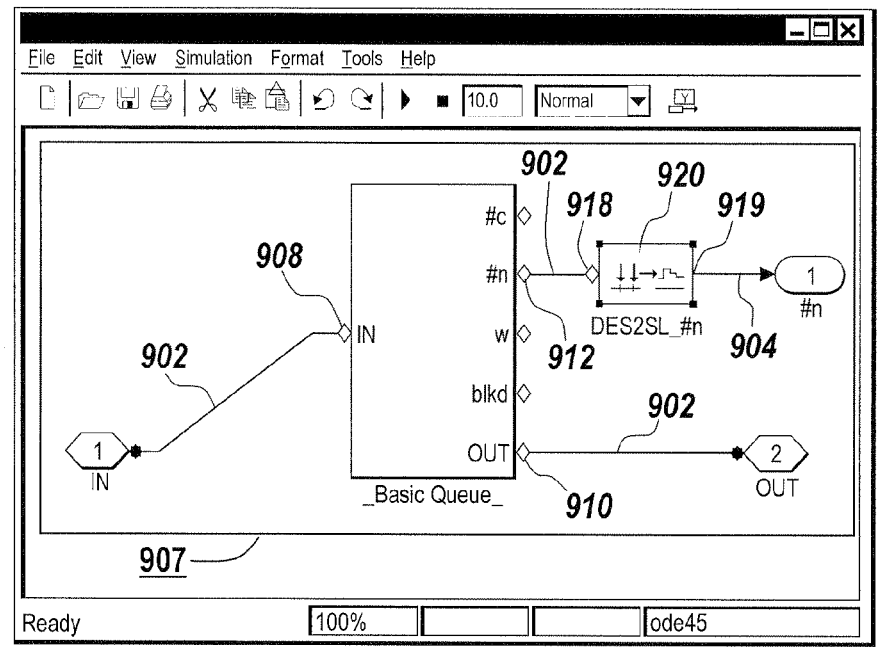
FIG. 23 is an illustrative view of a DES model block for use in accordance with the present invention.

FIG. 23 depicts a more detailed view of one example embodiment of the present invention. In particular, the inner workings of the Basic Queue block 907 are detailed, such that a gateway block 920, which provides for the transfer of information from the DES environment to an external environment, is depicted. The basic queue block 907 receives an entity at the input to the basic queue block 908 over the entity path 902. The basic queue block 907 can then pass this entity, or attributes relating to this entity, to another block within the block diagram model via the basic queue output port 910. The basic queue block can further pass the entity, or attributes relating to the entity, to a gateway port 912 on the basic queue block 907. The port 912 associated with the gateway block 920 allows for the passage of attribute information relating to the entity, via an entity path 902, to a gateway block 920 of the present invention. This gateway block 920 receives an entity attribute in the DES environment and converts this attribute into a data signal 904 capable of being utilized in an external model environment. In the present embodiment of FIG. 23, the gateway block 920 receives an entity attribute at the input port 918 of the gateway block via an entity path 902. The gateway block 920 is capable of bridging the timing and data management semantics between the DES environment of the block diagram model, and the requirements of the external environment in which the data signal is to be used.

In the present embodiment the gateway port 912 reports the number of entities that are currently stored in the basic queue block 907. The number of entities is updated upon successful arrival of an entity via the input port 908 and successful sending of an entity via the output port 910. The gateway port 912 of the present embodiment wherein the gateway port 912 outputs the number of entities within the basic queue block 907 is representative of data that may be provided to a gateway block 920. Additional data that may be provided to a gateway block 920, includes but is not limited to statistical data relating to the number of entities that have departed the basic queue block 907, the average wait time for entities within the basic queue block 907 or the status of the output port of the basic queue block 907, namely block or unblocked. Statistical data relating to the number of entities that have departed the basic queue block 907, and the average wait time for entities within the basic queue block 907 is updated upon departure of an entity from the basic queue block 907. The status of the output port of the basic queue block 907 is updated following an attempt to send an entity as well as departure of an entity from the basic queue block 907 using an optimization technique specific to the requirements of the external environment. For example, a conditional execution context can be used when the external environment is a Simulink® environment. Using a conditional execution context, the simulation speed of the model is increased as execution of blocks that are not specifically required for execution of the model may be avoided. The determination of which blocks do not require execution in a mode can be automatically configured, manually configured, or some combination of both.

At compile time of a Simulink® model using a conditional execution context, each block in the model is evaluated to determine whether its output is required only by a conditionally executed subsystem or its input changes only as a result of the execution of a conditionally executed subsystem. If a block meets these conditions, and the model provides for execution context propagation across blocks within the model, Simulink® can move the block into the execution context of the subsystem. This ensures that the block's methods are executed during the simulation loop only when the corresponding conditionally executed subsystem executes. Furthermore, using the conditional execution context, a mechanism is provided wherein blocks in the external Simulink® environment can be executed immediately after the update of the values associated with blocks contained within the external Simulink® environment.

The use of a conditional execution context environment within a Simulink® model has been used for illustrative purposes, and is not intended to serve as the only means by which efficiency of execution within a simulation can be enhanced. On skilled in the art will readily recognize that numerous alternative forms of simulation processing enhancements may be employed in conjunction with the present invention.

The gateway block then produces a data signal at output port 919 that is capable of being delivered to an external environment via a data signal path 904. The data signal passed to the external environment can have a value that is the same as the attribute value within the DES environment, or can have a modified value as compared to the entity attribute value within the DES environment. In one embodiment, this data signal 904 can be passed to a time based model for subsequent analysis or display. In an alternate embodiment, the data signal can be passed to a data flow based model in which dataflow is mapped to time. Those skilled in the art will readily recognize that the data signal passed from the gateway block in the DES environment can be further passed to any external environment wherein the signal is beneficial in analyzing the dynamic system at issue.

Figure 24A:
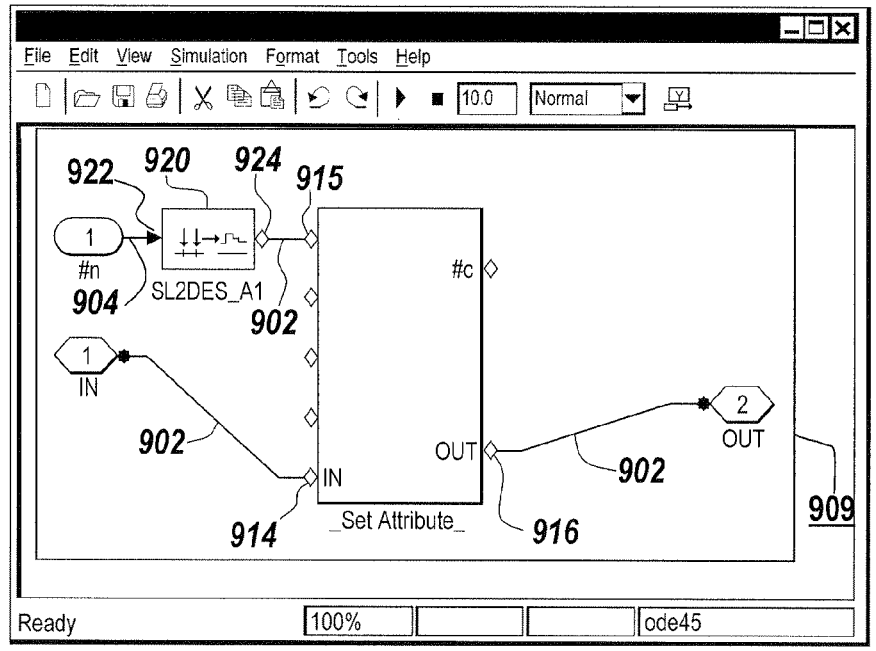
FIG. 24A is an illustrative view of a DES model block for use in accordance with the present invention.

FIG. 24A, illustrates an alternative embodiment of the present invention. In FIG. 24A the set attribute block 909 of FIG. 22 is depicted in greater detail. The set attribute block is capable of receiving an entity through entity path 902 at an input port 914. The set attribute block 909 can forward the entity via output port 916. The set attribute block 909 can further receive a data signal 904 from an external environment. This data signal 904 is first received at an input port 922 of the gateway block 920. This data signal 904 originates in a non-DES environment, and those of ordinary skill in the art will recognize that the data signal 904 may take numerous forms. For example, the data signal 904 can take the form of a data flow dependent signal or a time dependent signal. Examples of external environments capable of generating an appropriate data signal are represented by, but not limited to, Stateflow® and Simulink® by the MathWorks of Natick, Mass. In the present example, the attributes associated with an entity that is received via the entity path 902 at the input port 914 of the get attribute block 909 can be modified based upon data received from the external environment by the gateway block 920.

Figure 24B:
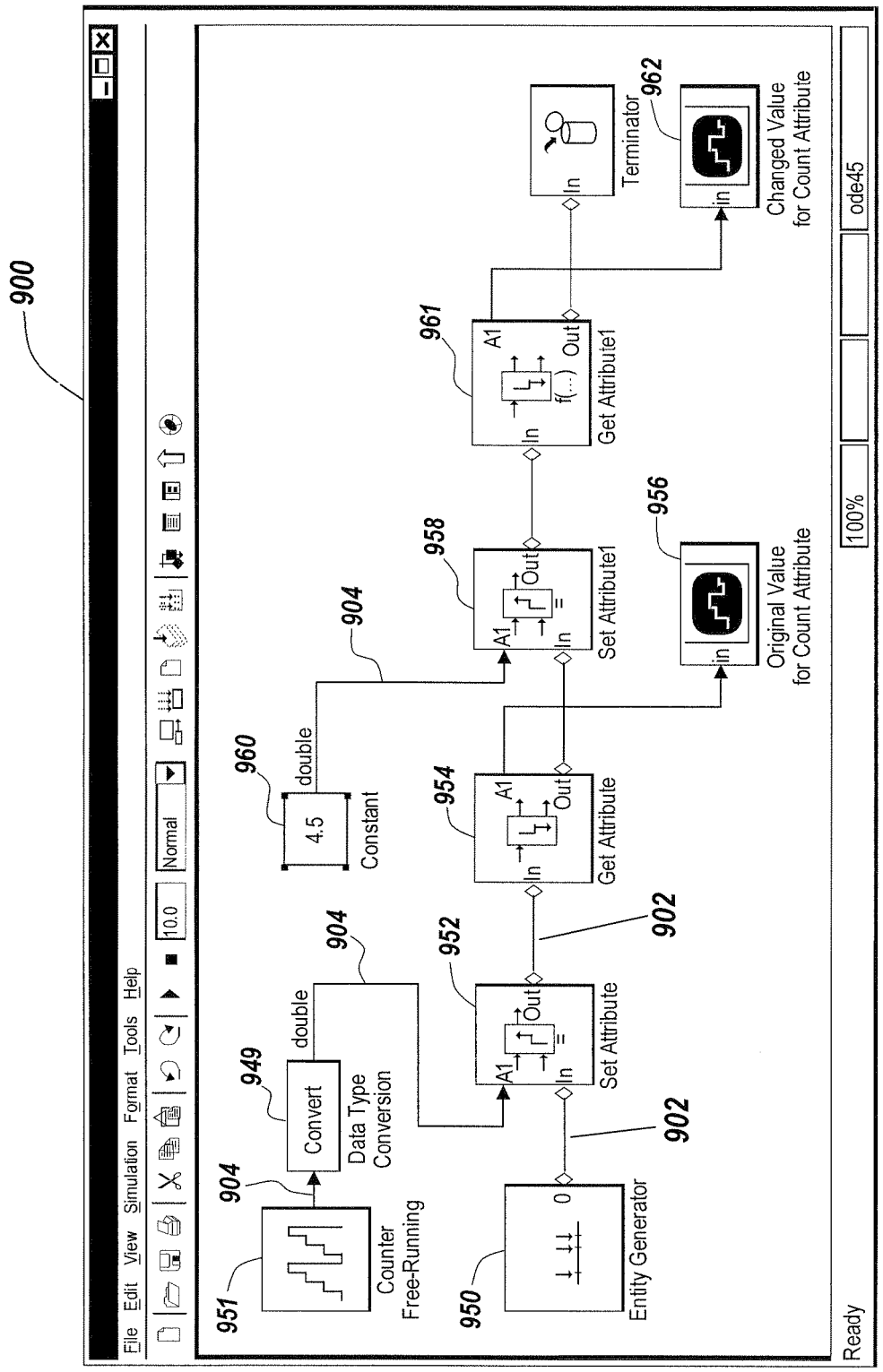
FIG. 24B is an illustrative embodiment of DES model of the present invention when used with an external invention.
Figure 24C:
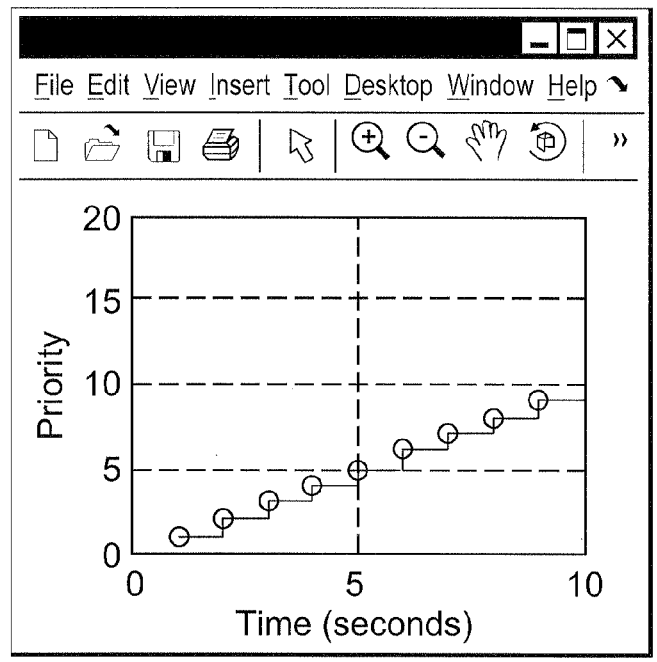
FIG. 24C is a graphical representation of an entity attribute of the present invention.

FIG. 24B of the present invention illustrates the modification of the attributes associated with an entity based upon a system model. In FIG. 24B an entity generator 950 generates an entity and passes said entity to a first set attribute block 952 via an entity path 902. Further associated with the first set attribute block 952 is a convert block 949 that can change the data type of the time-driven signal in the external environment. The first set attribute block 952 can convert a data signal from an external environment 904 for use with the DES model environment using a gateway block (not shown) A gateway block can be associated with any applicable blocks within the DES model environment, such that the integration of an external data signal into the DES environment is completed without the need for a user to manually configure a gateway block. The presence of a gateway block with a DES block, therefore, is not immediately depicted on a DES model illustrated in FIG. 24B, but should a user elect to examine any DES block more closely, the associated gateway block for use in interacting with the external environment can be examined. In the present embodiment, the external environment 951 is a free running counter. The first set attribute block 952 passes entity data to a first get attribute block 954 via an entity pathway 902. Associated with the first get attribute block 954 is a scope block 956, wherein the scope block graphically plots data contained within the first set attribute block 952. An illustrate plot of data contained within the first set attribute block 952 is graphically depicted in FIG. 24C, wherein priority is plotted as a function of time.

Figure 24D:
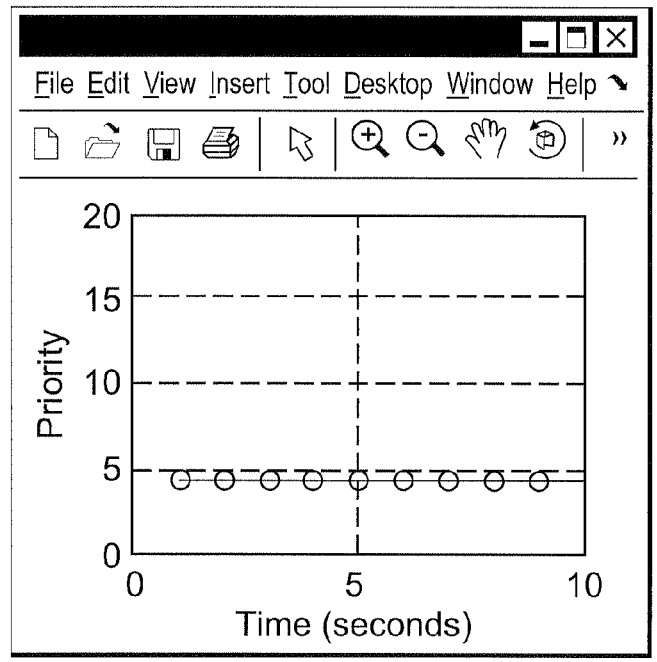
FIG. 24D is a graphical representation of an entity attribute of the present invention.

The first get attribute block 954 further passes an entity to a second set attribute block 958. Associated with the constant block 960 located in an external environment. Signal data from the constant block 960 is provided to the second set attribute block 958. The second set attribute block 958 can have an embedded gateway block associated with the second set attribute block as depicted in FIG. 24A. Data contained within the second get attribute block 961 is graphically displayed on a second scope block 962. A graphical depiction of the data plotted by the second scope block is depicted in FIG. 24D. As evidenced in FIG. 24D, following the introduction of a constant from a constant block 960 in the external environment, the attributes of entities contained within the second set attribute block 958 are altered.

Furthermore, as evidenced in FIG. 24A, the gateway block may assign and generate a new attribute, to be associated with a passing entity, based upon data received from the external environment. If the gateway block 920 receives a data signal 904 from an external environment that results in the production of an entity attribute that is not recognized by the set attribute block 909, the set attribute block 909 can either create the attribute and assign the new value, or can create the attribute and assign a new value, while simultaneously warning the user that an unexpected input from the external environment has been received.

Figure 25:
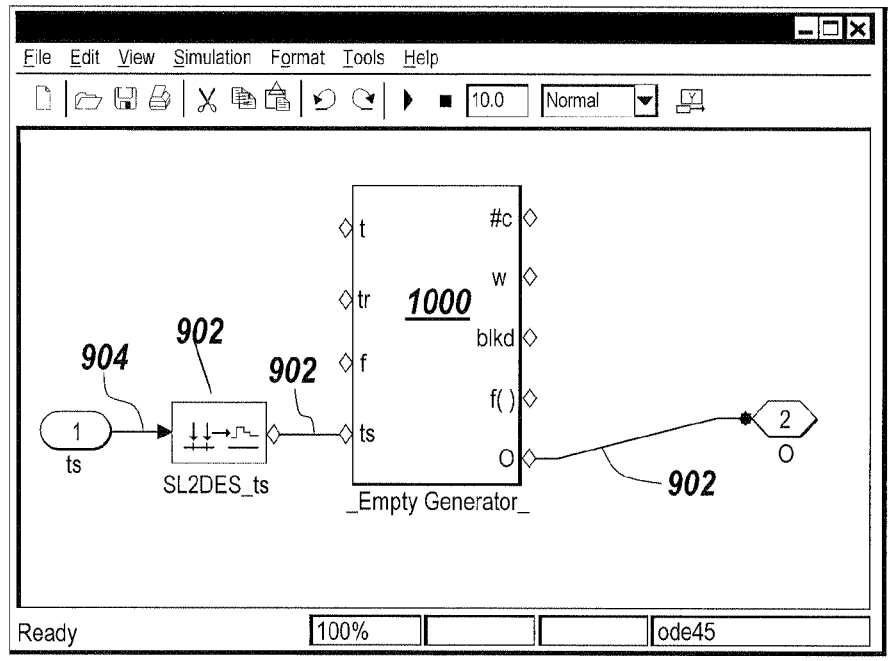
FIG. 25 is an illustrative view of a DES model block for use in accordance the present invention.

FIG. 25 illustrates a representative embodiment of the present invention when used with a time based model source signal. An entity generator 1000 receives a data signal 904 through a gateway block 920. The gateway block of the present embodiment is capable of converting a data signal referenced to a time based model sample time into an entity for use with a DES model. In the present embodiment, for instance, a signal to create a new entity is passed from the gateway block 920 to the entity generator 1000 at a rate which coincides with the sample time of the time based model.

Figure 26:
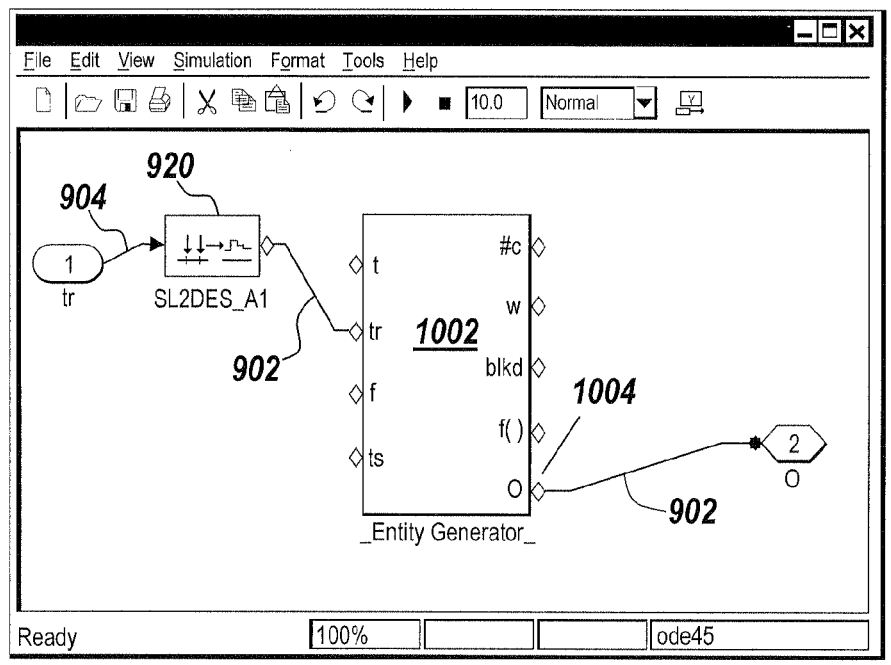
FIG. 26 is an illustrative view of a DES model block for use in accordance with the present invention.

FIG. 26 illustrates an alternate embodiment of the present invention when used in conjunction with a time driven model environment that provides a trigger signal. Those skilled in the art will recognize that the trigger signal in the external environment can take numerous forms beyond a time driven model environment trigger signal. In response to the reception of a trigger signal from an external environment, such as Stateflow®, the gateway block 920 can communicate with an entity generator 1002 via an entity path 902, thereby instructing the entity generator to generate a new entity. This new entity can then be introduced into the DES model via the entity generator output port 1004. In the present embodiment, a new entity will only be generated upon receiving a trigger signal from the external environment. To determine if a trigger signal is present an initial trigger signal value will be stored. The triggering of the entity generator will therefore occur upon reception of a secondary signal that is greater than the initial signal, less than the initial signal, or greater than or less than the initial signal.

Figure 27A:
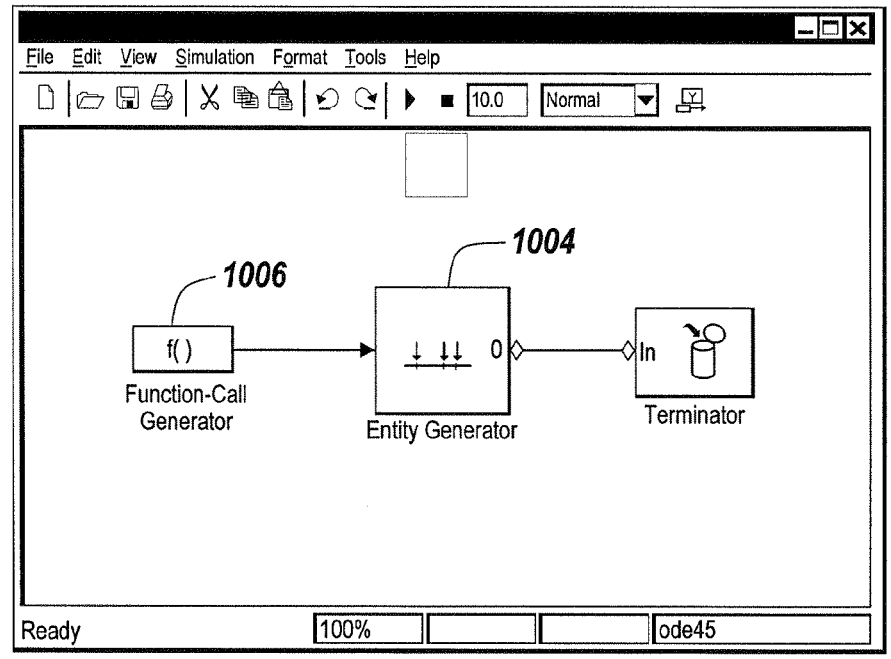
FIG. 27A is an illustrative view of a DES model for use in accordance with the present invention.

The gateway block 920 of the present invention can further be utilized in interfacing an external environment to a DES environment based upon the execution of a function call 1006 in the external environment. Such a situation is illustrated in FIG. 27A. A function call 1006 in the external environment can be passed to the entity generator 1004 block through a gateway block (not shown) associated with the entity generator block through a gateway block. Those skilled in the art will appreciate that DES block can have embedded gateway blocks for communication with an external environment. An embedded gateway block such as this allows a user to send and receive data to or from an external environment without needing to manually configure a standalone gateway block for use with the DES environment.

The embedded gateway block (not shown) associated with the entity generator is used in interfacing an external environment to a DES environment upon execution of a function call in the external environment uses the semantics of the external environment to generate an entity by the entity generator 1004. The processing of a function call 1006 in the external environment, therefore, can instruct the entity generator 1004 to generate an entity for use in the DES model environment.

Figure 27B:
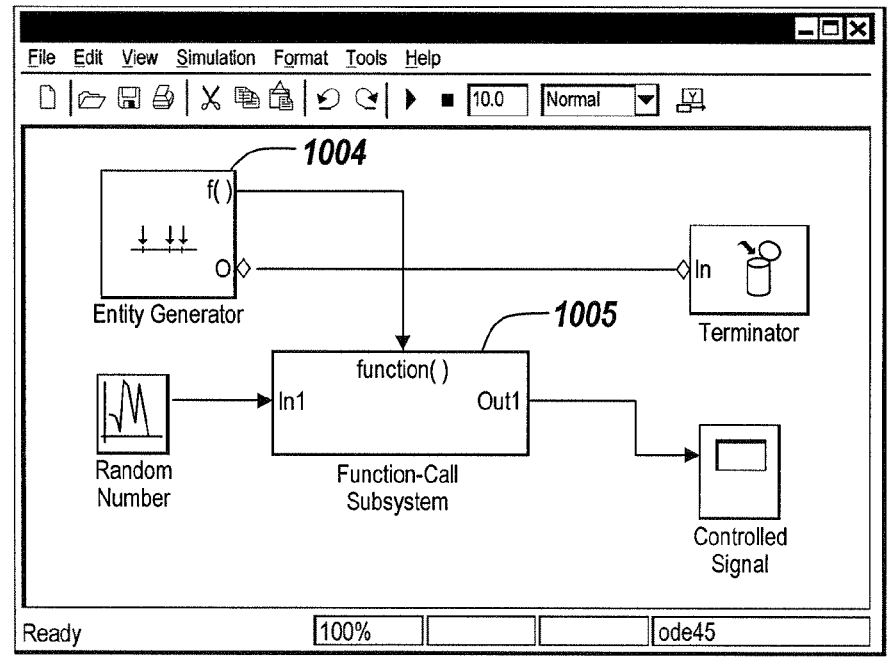
FIG. 27B is an illustrative view of a DES model for use in accordance with the present invention.

As illustrated in FIG. 27B, an entity generator 1004 in the DES environment can call a function call in a function call subsystem 1005 in an external environment. The interaction between the DES environment and function call subsystem in the external environment 1005 can occur using a gateway block (not shown) associated with the DES environment. The calling of a function in the external environment does not require the passage of data from the DES model environment, but rather passes an instruction for use in calling a function in the external environment.

Gateway blocks in accordance with the present invention can be associated with numerous blocks beyond those illustrated in the figures. A user of a DES block diagram model can associate a gateway block with any existing DES model environment block such that the intended dynamic model execution is best analyzed using both the DES environment as well as a non-DES external environment. For example, a DES block diagram model can have a Set Attribute block associated with a gateway block such that an external data signal from a non-DES environment can be utilized in generating a modified entity.

Figure 28:
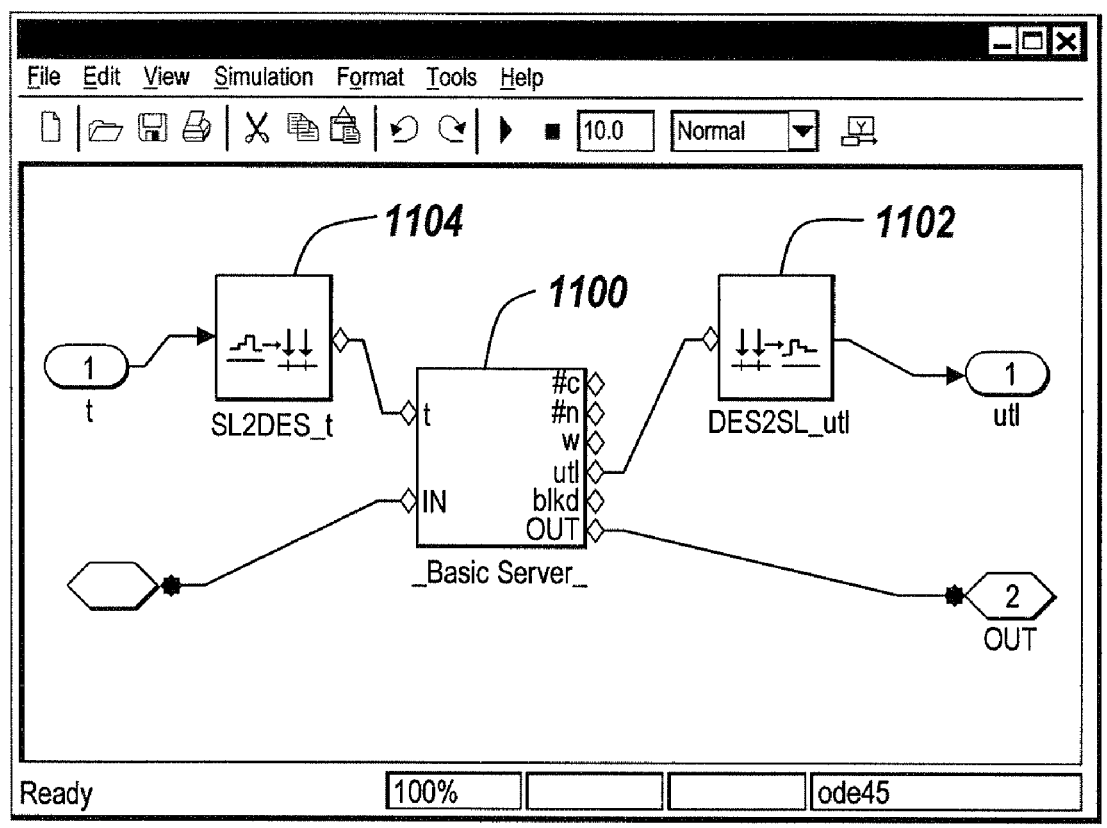
FIG. 28 is an alternate embodiment of the present wherein a block is associated with a plurality of gateway blocks.

FIG. 28 illustrates an alternate embodiment of the present invention wherein a block, namely a basic server block 1100, within the block diagram model environment is associated with a plurality of gateway blocks 1102, 1104. These gateway blocks 1102, 1004 provide for the interface of a data signal into the DES environment, as well as the transfer of a data signal from the DES environment.

Figure 29:
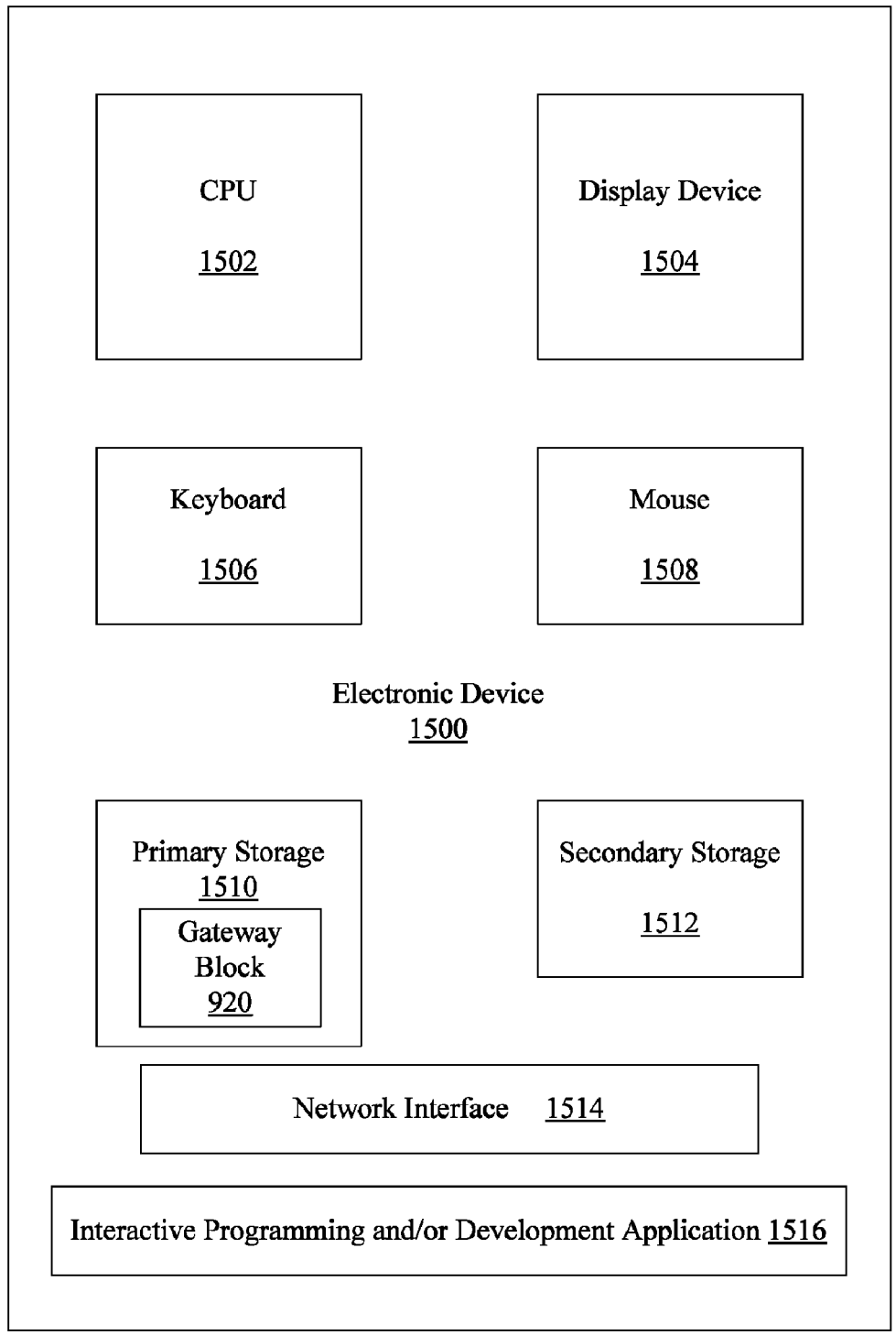
FIG. 29 is an illustrative electronic device for use with the present invention.

FIG. 29 is an example embodiment of an electronic device 1500 suitable for practicing the illustrative embodiments of the present invention. The electronic device 1500 is representative of a number of different technologies, such as personal computers (PCs), laptop computers, workstations, personal digital assistants (PDAs), Internet appliances, cellular telephones, and the like. In the illustrated embodiment, the electronic device 1500 includes a central processing unit (CPU) 1502 and a display device 1504. The display device 1504 enables the electronic device 1500 to communicate directly with a user through a visual display. The electronic device 1500 further includes a keyboard 1506 and a mouse 1508. Other potential input devices not depicted include a stylus, trackball, joystick, touch pad, touch screen, and the like. The electronic device 1500 includes primary storage 1510 and secondary storage 1512 for storing data and instructions. The storage devices 1510 and 1512 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 1510 and 1512. The electronic device 1500 can also include a network interface 1514 for communicating with one or more electronic devices external to the electronic device 1500 depicted. A modem is one form of network interface 1514 for establishing a connection with an external electronic device or network. The CPU 1502 has either internally, or externally, attached thereto one or more of the aforementioned components. In addition to applications previously mentioned, modeling applications can be installed and operated on the electronic device 1500.

It should be noted that the electronic device 1500 is merely representative of a structure for implementing the present invention. However, one of ordinary skill in the art will appreciate that the present invention is not limited to implementation on only the described device 1500. Other implementations can be utilized, including an implementation based partially or entirely in embedded code, where no user inputs or display devices are necessary. Rather, a processor can communicate directly with another processor or other device.

The illustrative embodiment has been described solely for illustrative purposes relative to the technical computing environment of MATLAB® and Simulink® from The MathWorks, Inc. of Natick, Mass. Although the illustrative embodiment will be described relative to a MathWorks-based application, one of ordinary skill in the art will appreciate that the present invention may be applied to other graphical modeling environments and technical computing environments, such as any technical computing environments using software products of LabVIEW®, MATRIXx from National Instruments, Inc., Mathematica® from Wolfram Research, Inc., Mathead of Mathsoft Engineering & Education Inc., Dymola from Dynasim AB, or Maple™ from Maplesoft, a division of Waterloo Maple Inc. Furthermore, one ordinarily skilled in the art will appreciate that the present invention may apply to any graphical modeling environment, such as one providing modeling with a Unified Modeling Language (UML), Hardware Description Language (HDL), or that provides a physics modeling domain.

The present invention has been described by way of example, and modifications and variations of the described embodiments will suggest themselves to skilled artisans in this field without departing from the spirit of the invention. Aspects and characteristics of the above-described embodiments may be used in combination. The described embodiments are merely illustrative and should not be considered restrictive in any way. The scope of the invention is to be measured by the appended claims, rather than the preceding description, and all variations and equivalents that fall within the range of the claims are intended to be embraced therein.

I claim:

1. A method comprising:
   receiving at a gateway block, an entity from an event-driven block of a block diagram model of a system, the event-driven block defining behavior of a portion of the system in terms of states occurring in response to discrete events, the entity being received on an entity path, the entity path being associated with no value when no entity is passing through the entity path;
   generating in the gateway block, using a processor, a time-varying data signal descriptive of the entity based at least on at least one of data and an attribute included in the entity; and
   passing from the gateway block, the generated data signal to one or more time-driven blocks of the model of the system via one or more signal paths, the one or more time-driven blocks defining behavior of a portion of the system in terms of response to time.

2. The method of claim 1 further comprising:
   passing the entity to another event-driven block of the block diagram model.

3. The method of claim 1 wherein the entity includes an attribute, and the generating further comprises:
   setting a value of the data signal in response to a value of the attribute.

4. The method of claim 1 wherein the entity includes an attribute and the attribute is a Boolean, a real number, an integer number, an enumerated type, a string, a vector, a matrix, or a frame.

5. The method of claim 1 wherein the entity includes an attribute and the method further comprises:
   passing the attribute to another event-driven block of the block diagram model.

6. The method of claim 1 further comprising:
   maintaining an entity count;
   updating the entity count in response to receiving the entity; and
   setting a value of the data signal in response to the entity count.

7. The method of claim 1 wherein the one or more time-driven blocks include a function call subsystem, and the data signal includes an instruction to cause the function call subsystem to call a function.

8. The method of claim 1 wherein the event-driven block is maintained in a discrete-event modeling environment, and the one or more time-driven blocks are maintained in a time-based modeling environment.

9. A method comprising:
   receiving at a gateway block, a time-varying data signal from a time-driven block of a block diagram model of a system via a signal path, the time-driven block defining behavior in terms of response to time;
   receiving at the gateway block, using a processor, an entity from an event-driven block of the block diagram model, the event-driven block defining behavior in terms of states occurring in response to discrete events, the entity being received on an entity path, the entity path being associated with no value when no entity is passing through the entity path; and
   modifying in the gateway block, at least one of data and an attribute included in the entity based at least on a value of the received data signal.

10. The method of claim 9 wherein the entity includes an attribute and a value of the attribute is set to equal the value of the data signal.

11. The method of claim 9 wherein the entity includes an attribute and the attribute is a Boolean, a real number, an integer, an enumerated type, a string, a vector, a matrix, or a frame.

12. The method of claim 9 wherein the data signal is passed on a data signal path, the entity path that the entity is received on is a first entity path, and wherein the entity includes an attribute having a value, the value of the attribute is modified, and the entity with the attribute having the modified value is passed on a second entity path.

13. The method of claim 9 wherein the event-driven block is maintained in a discrete-event modeling environment and the time-driven block is maintained in a time-based modeling environment.

14. An electronic-device-readable non-transitory media comprising instructions executable by a processor, the media comprising one or more instructions that when executed by the processor performs:
   receiving at a gateway block an entity from an event-driven component of a model, the event-driven component defining behavior of a portion of a system in terms of states occurring in response to discrete events, the entity being received on an entity path, the entity path being associated with no value when no entity is passing through the entity path;
   generating in the gateway block a time-varying data signal descriptive of the entity based at least on at least one of an attribute and data included in the entity; and
   passing from the gateway block the generated data signal to one or more time-driven components of the model via one or more signal paths, the time-driven components defining behavior of a portion of the system in terms of response to time.

15. The electronic-device-readable media of claim 14 wherein the model is a block diagram model, the event-driven component is an event-driven block, and the time-driven component is a time driven block.

16. The electronic-device-readable media of claim 14 wherein the entity includes an attribute that is a Boolean, a real number, an integer number, an enumerated type, a string, a vector, a matrix or a frame.

17. The electronic-device-readable media of claim 14 further comprising one or more instructions that when executed by the processor performs:
  passing the entity to another event-driven component of the model.

18. The electronic-device-readable media of claim 14 further comprising one or more instructions that when executed by the processor performs:
  generating a graphical representation of the data signal.

19. The electronic-device-readable media of claim 14 wherein the event-driven component is maintained in a discrete-event modeling environment and the one or more time-driven components are maintained in a time-based modeling environment.

20. An apparatus comprising:
  means for receiving at a gateway block a time-varying data signal from a time-driven block of a block diagram model of a system via a signal path, the time-driven block defining behavior in terms of a response to time, the entity being received on an entity path, the entity path being associated with no value when no entity is passing through the entity path;
  a processor generating in the gateway block an entity the entity including at least one of an attribute and data that is generated based at least on the received data signal; and
  means for passing the entity from the gateway block to an event-driven block of the block diagram model, the event-driven block defining behavior in terms of states occurring in response to discrete events.

21. An apparatus comprising:
  a processor to:
  execute a model of a system, the model including:
    a first portion with one or more time-driven components, the time-driven components passing one or more time-varying data signals via one or more signals via one or more signal paths to a gateway block, and
    a second portion with one or more event-driven components, the event-driven components passing one or more entities, the one or more entities being passed on an entity path to the gateway block, the entity path being associated with no value when no entity is passing through the entity path, and
    generate in the gateway block an entity based at least on a time-varying data signal from a time-driven component of the first portion.

22. The apparatus of claim 21 wherein the model is a block diagram model, the one or more event-driven components are event-driven blocks, and the one or more time-driven components are time driven blocks.

23. The apparatus of claim 21 wherein the entity includes an attribute, and a value of the attribute is set in response to the data signal.

24. An electronic-device-readable non-transitory media comprising instructions executable by a processor, the media comprising one or more instructions that when executed by the processor performs:
  receiving in a gateway block a time-varying data signal from a time-driven block of a block diagram model via a signal path, the time-driven block defining behavior in terms of response to time;
  receiving in the gateway block an entity from an event-driven block of the block diagram model, the event-driven block defining behavior in terms of one or more states occurring in response to discrete events, the entity being received on an entity path, the entity path being associated with no value when no entity is passing through the entity path; and
  modifying in the gateway block at least one of an attribute and data included in the entity based at least on a value of the received data signal.

* * * * *